(12) United States Patent
Mizuno et al.

(10) Patent No.: US 7,944,060 B2
(45) Date of Patent: May 17, 2011

(54) DEVICE PACKAGE STRUCTURE, DEVICE PACKAGING METHOD, DROPLET EJECTION HEAD, CONNECTOR, AND SEMICONDUCTOR DEVICE

(75) Inventors: Shinji Mizuno, Matsumoto (JP); Yoshihide Nishiyama, Chino (JP); Eiichi Sato, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/543,571

(22) Filed: Aug. 19, 2009

(65) Prior Publication Data

US 2009/0309242 A1  Dec. 17, 2009

Related U.S. Application Data

(62) Division of application No. 11/337,921, filed on Jan. 23, 2006, now Pat. No. 7,595,562.

(30) Foreign Application Priority Data

Jan. 25, 2005 (JP) ................. 2005-017261
Mar. 3, 2005 (JP) ................. 2005-059029
Nov. 4, 2005 (JP) ................. 2005-320609

(51) Int. Cl.
  *H01L 23/52*  (2006.01)
  *H01L 29/40*  (2006.01)
  *B41J 2/05*   (2006.01)
(52) U.S. Cl. . 257/786; 257/701; 257/734; 257/E23.141; 347/50; 347/58; 347/59; 347/68

(58) Field of Classification Search ................. 257/786, 257/701, 734, E23.141; 347/50, 58, 59, 68
See application file for complete search history.

(56) References Cited

U.S. PATENT DOCUMENTS

| | | | |
|---|---|---|---|
| 4,631,820 A | 12/1986 | Harada et al. | |
| 4,668,032 A | 5/1987 | Bouvier et al. | |
| 5,714,800 A * | 2/1998 | Thompson | 257/690 |
| 6,702,413 B2 | 3/2004 | Takabayashi et al. | |
| 6,911,734 B2 | 6/2005 | Kikuchi et al. | |
| 7,299,545 B2 | 11/2007 | Yamauchi et al. | |
| 7,380,338 B2 | 6/2008 | Lee | |
| 7,402,901 B2 | 7/2008 | Hatano et al. | |
| 2003/0146510 A1* | 8/2003 | Chien | 257/738 |
| 2004/0105378 A1* | 6/2004 | Katou et al. | 369/121 |
| 2004/0238935 A1* | 12/2004 | Yoshimura | 257/686 |
| 2005/0173614 A1* | 8/2005 | Hwang et al. | 250/201.5 |
| 2005/0189640 A1 | 9/2005 | Grundy et al. | |
| 2006/0097370 A1 | 5/2006 | Bartley et al. | |
| 2006/0273446 A1 | 12/2006 | Sato et al. | |
| 2008/0073027 A1 | 3/2008 | Yamauchi et al. | |
| 2008/0093114 A1 | 4/2008 | Lee | |

FOREIGN PATENT DOCUMENTS

JP  61-069191  4/1986

(Continued)

*Primary Examiner* — Angel Roman
(74) *Attorney, Agent, or Firm* — Harness, Dickey & Pierce, P.L.C.

(57) ABSTRACT

A device package structure includes: a base body having a conductive connection portion and a level difference portion; a device arranged on the base body, having a connection terminal electrically connected to the conductive connection portion via the level difference portion on the base body; and a connector electrically connecting the connection terminal and the conductive connection portion, having substantially the same height as a height of the level difference portion.

1 Claim, 13 Drawing Sheets

FOREIGN PATENT DOCUMENTS

| | | |
|---|---|---|
| JP | 10-064953 | 3/1998 |
| JP | 2000-127379 | 5/2000 |
| JP | 2000-252381 | 9/2000 |
| JP | 2000-301719 | 10/2000 |
| JP | 2002-009235 | 1/2002 |
| JP | 2002-217240 | 8/2002 |
| JP | 2003-159800 | 6/2003 |
| JP | 2004-284176 | 10/2004 |
| JP | 2006-068989 | 3/2006 |
| TW | 200306634 | 4/1992 |
| TW | I237533 | 8/2005 |

* cited by examiner

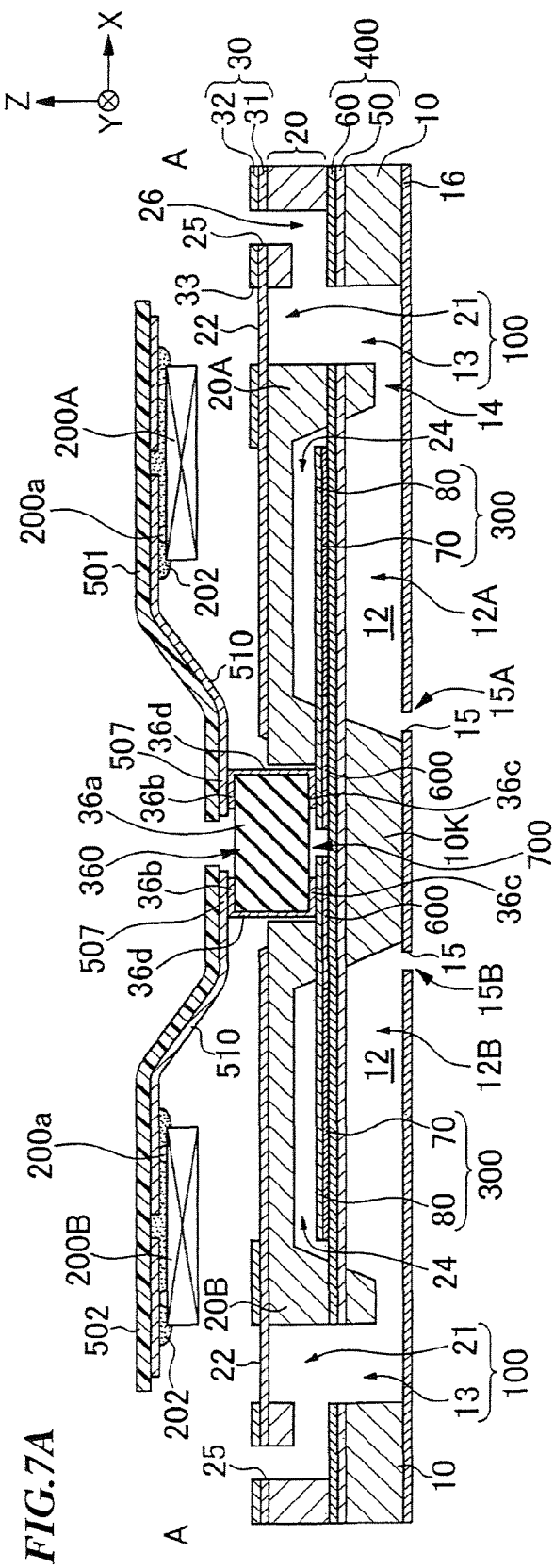
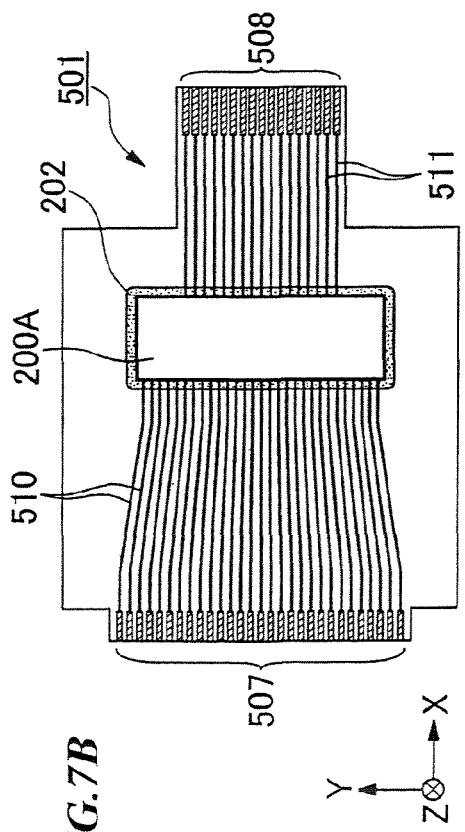
FIG. 7A
FIG. 7B

DEVICE PACKAGE STRUCTURE, DEVICE PACKAGING METHOD, DROPLET EJECTION HEAD, CONNECTOR, AND SEMICONDUCTOR DEVICE

CROSS-REFERENCE TO RELATED APPLICATION

This is a divisional application of U.S. Ser. No. 11/337,921, filed Jan. 23, 2006, claiming priority to Japanese Patent Application No. 2005-017261, filed Jan. 25, 2005, Japanese Patent Application No. 2005-059029, filed Mar. 3, 2005, and Japanese Patent Application No. 2005-320609, filed Nov. 4, 2005, the contents of which are incorporated herein by reference.

BACKGROUND

1. Technical Field

The present invention relates to a device package structure, a device packaging method, a droplet ejection head and connector, and a semiconductor device.

2. Related Art

As a method of arranging a device such as an IC chip on a circuit board and electrically connecting them, a wirebonding method is known and generally used. For example, as disclosed in Japanese Unexamined Patent Application, First Publication No. 2000-127379, Japanese Unexamined Patent Application, First Publication No. 2003-159800, and Japanese Unexamined Patent Application, First Publication No. 2004-284176, in an droplet ejection head (inkjet type recording head) that is used when a droplet ejection method (inkjet method) is applied for forming an image and manufacturing a microdevice, a wirebonding method is also used to connect a piezoelectric element for performing an ink ejection operation, and a driving circuit (such as an IC chip) which supplies an electric signal to the piezoelectric element.

However, the abovementioned related art has the following problems. Recently, together with the high integration of IC chips and the like, there is a tendency in that the external connection terminal of the IC chip and the like is becoming narrower at a narrower pitch. Together with this, there is also a tendency that the pitch of the wiring pattern formed on the circuit board is becoming narrower. Therefore, it is becoming more difficult to apply the aforementioned connection method which uses wirebonding.

Moreover, in a method of forming an image and manufacturing a microdevice based on the droplet ejection method, in order to improve the definition of the image and to miniaturize the microdevice, the distance (nozzle pitch) between nozzle openings that are provided in the droplet ejection head is preferably made as small (narrow) as possible. Since a plurality of the piezoelectric elements are formed corresponding to the nozzle openings, it is necessary to make the nozzle pitch small, and to make the distance between the piezoelectric elements small according to the nozzle pitch. However, if the distance between the piezoelectric elements becomes smaller, it becomes difficult to connect the respective plurality of piezoelectric elements and the driver IC by the wirebonding method.

SUMMARY

An advantage of some aspects of the invention is to provide a device package structure, a droplet ejection head, and a connector, which enable to package a device with superior reliability and excellent yield without decreasing workability at the time of electrical connection, even if the formation pitch of the connection terminals and the connection portion becomes narrower. Furthermore, an advantage of some aspects of the invention is to provide a method of packaging a device with superior reliability and excellent yield.

A first aspect of the invention provides a device package structure, including: a base body having a conductive connection portion and a level difference portion; a device arranged on the base body, having a connection terminal electrically connected to the conductive connection portion via the level difference portion on the base body; and a connector electrically connecting the connection terminal and the conductive connection portion, having substantially the same height as a height of the level difference portion.

According to this device package structure, when various devices such as a semiconductor element are packaged on the base body, if the connection terminal of the device, and the conductive connection portion of the base body are separated via a level difference portion, since a connector having substantially the same height as that of the level difference portion is used, the level difference portion can be eliminated with a very simple configuration. Consequently, in the device package structure of this aspect of the invention, a device can be packaged efficiently and reliably at low cost.

A second aspect of the invention provides a device package structure, including: a base body having a conductive connection portion and a level difference portion; a device arranged on the base body, having a connection terminal electrically connected to the conductive connection portion via the level difference portion on the base body; and a connector electrically connecting the connection terminal and the conductive connection portion, having a height greater than a height of the level difference portion.

According to this device package structure, since a connector with a height greater than the height of the level difference portion is used, the conductive connection portion led out by the connector is arranged to protrude from the level difference portion, facilitating work related to electrical connection to the connector.

It is preferable that the device package structure of the first aspect of the invention or the second aspect of the invention further include a connector laminated body having a plurality of the connectors in laminations. The connector laminated body is arranged between the connection terminal of the device and the conductive connection portion of the base body.

According to this configuration, by adjusting the number of laminations of the connectors according to the height of the level difference portion, the position of the connection terminal of the device and the connector can be adjusted. Therefore a package structure, in which a device can be readily conductively connected, can be obtained.

It is preferable that, in the device package structure of the first aspect of the invention or the second aspect of the invention, the connector include a base member and a terminal electrode.

It is preferable that, in the device package structure of the first aspect of the invention or the second aspect of the invention, the terminal electrode pierce through the base member.

By using the connector including a terminal electrode piercing through the base member, a first face of the base member and a second face of an opposite side of the first face of the base member can be conducted while avoiding contact with other members provided on the base body. Therefore a device package structure with a simple configuration and superior reliability can be obtained.

It is preferable that, in the device package structure of the first aspect of the invention or the second aspect of the invention, the base member of the connector include: a first face; a second face of an opposite side of the first face; and a third face being difference of the first face and the second face; the terminal electrode of the connector include: a first terminal electrode formed on the first face of the base member; a second terminal electrode formed on the second face of the base member; and a connection wiring formed on the third face of the base member, electrically connecting between the first terminal and the second terminal.

Also by this configuration, a package structure with a simple configuration and superior reliability can be also obtained.

It is preferable that, in the device package structure of the first aspect of the invention or the second aspect of the invention, the base member of the connector be a glass epoxy, Si, a ceramic, or a glass.

By using these base members, a connector with superior reliability can be produced at low cost, and hence the device package structure can be formed at low cost.

It is preferable that, in the device package structure of the first aspect of the invention or the second aspect of the invention, a constituent material of the terminal electrode of the connector be any one of: a metal material selected from a group consisting of Cu, Ni, Au, and Ag; an alloy of a metal material selected from the same group; a brazing filler metal; and a conductive resin material.

It is preferable that the device package structure of the first aspect of the invention or the second aspect of the invention further include a through hole piercing through the base body, the conductive connection portion is formed on an outer face or an inner face of the base body, the through hole reaching the conductive connection portion, the connector is arranged in the through hole, and the connector electrically connecting between the connection terminal of the device and the conductive connection portion.

According to this configuration, even if the base body itself forms a level difference portion between the device and the conductive connection portion, a package structure in which the connection terminal of the device and the conductive connection portion of the base body can be reliably electrically connected, can be provided.

A third aspect of the invention provides a device package structure including: a base body, including a first face, a level difference portion, and a second face formed on the first face via the level difference portion; a device arranged on the base body; a first conductive connection portion formed on the first face; a device arranged on the base body, having a connection terminal arranged on the second face and electrically connected to the first conductive connection portion; a second conductive connection portion formed on the second face and electrically connected to the connection terminal of the device; and a connector electrically connecting the first conductive connection portion and the second conductive connection portion, having the same height as a height of the level difference portion.

Consequently, in the device package structure of this aspect of the invention, when various devices such as a semiconductor element are packaged on the base body, if the connection terminal of the device, and the first conductive connection portion of the base body are separated via a level difference portion, since a connector having at least the height of such a level difference portion is used, the level difference portion can be eliminated with a very simple configuration. Consequently, in the device package structure of this aspect of the invention, a device can be packaged efficiently and reliably at low cost. Moreover, in this aspect of the invention, by measuring the second conductive connection portion connected to the connection terminal of the device, it is possible to check the conduction of the device before packaging the connector.

It is preferable that, in the device package structure of the third aspect of the invention, the connector include: a first terminal electrode connected to the first conductive connection portion; a second terminal electrode connected to the second conductive connection portion; and a connection wiring electrically connecting the first terminal electrode and the second terminal electrode.

As a result, in this aspect of the invention, the first conductive connection portion and the connection terminal of the device are connected by the first terminal electrode and the second terminal electrode that are connected via the connection wiring.

It is preferable that, in the device package structure of the third aspect of the invention, the connector have an inclined-face between a face on which the first terminal electrode is formed, and a face on which the second terminal electrode is formed, and the connection wiring is formed on the inclined-face.

As a result, in this aspect of the invention, the inclined-face intersects at an obtuse angle with respect to the face formed with the first terminal electrode and the face formed with the second terminal electrode. Therefore, it is possible to reduce the stress concentration applied to the connection wiring, and to avoid the occurrence of disconnection and the like. Moreover, for example, if a film is formed over the connection wiring by the droplet ejection method, it is possible to readily form a film, compared to a case where a film is formed over faces orthogonal to each other.

It is preferable that, in the device package structure of the third aspect of the invention, the first terminal electrode be formed with a first conductive projected portion, the second terminal electrode be formed with a second conductive projected portion.

Here, the first conductive projected portion and the second conductive projected portion mean bumps. In this configuration, the difference in the height of the connector when the connector is packaged on the base body can be absorbed, and since the bumps can be formed when the first terminal electrode and the second terminal electrode, and the connection wiring are produced, manufacture is facilitated compared to the case where the bumps are formed on the base body.

It is preferable that, in the device package structure of the third aspect of the invention, a constituent material of at least either one of the first terminal electrode and the second terminal electrode be any one of: a metal material selected from a group consisting of Cu, Ni, Au, and Ag; an alloy of a metal material selected from the same group; a brazing filler metal; and a conductive resin material.

It is preferable that, in the device package structure of the third aspect of the invention, a coefficient of linear expansion of the base body and a coefficient of linear expansion of the connector be substantially same.

Therefore, in this aspect of the invention, even if the temperature of the base body or the connector fluctuates, the occurrence of exfoliation and the like in the conductive connection portion, with volume change due to temperature change can be effectively prevented.

It is preferable that, in the device package structure of the third aspect of the invention, the device be formed with a first conductive projected portion, the connector be formed with a second conductive projected portion, the device and the base body be electrically connected via the first conductive projected portion, the connector and the base body be electrically connected via the second conductive projected portion.

Here, the device and the connector are each flip chip packaged on the base body. As a result, in this aspect of the invention, it is possible to package the device and the connector by means of the same device (packaging device), contributing to an improvement in production efficiency. The flip chip package means an electronic component or semiconductor device, mounted directly onto a substrate or a board. In the flip chip package, an electrical connection is achieved through conductive bumps (conductive projected portion) built on the surface of the electronic component or the semiconductor device.

It is preferable that, in the device package structure of the third aspect of the invention, the base member of the connector be a glass epoxy, Si, a ceramic, or a glass.

By using these base members, a connector with superior reliability can be produced at low cost, and hence the device package structure can be formed at low cost.

It is preferable that, in the device package structure of the third aspect of the invention, the connector have a mark for detecting a position when the connector is packaged on the base body.

As a result, when the connector is packaged on the base body, by detecting the mark, it is possible to detect the position of the connector, and perform positioning with respect to the base body.

A forth aspect of the invention provides a semiconductor device including: a base body; and an electronic device packaged on the base body by the above-mentioned device package structure.

According to this configuration, a highly reliable semiconductor device including a package structure with superior electrical reliability can be provided.

A fifth aspect of the invention provides a droplet ejection head including: a nozzle opening ejecting droplets; a pressure generating chamber communicating the nozzle opening; a drive element arranged outside of the pressure generating chamber, generating a pressure change in the pressure generating chamber; a protective substrate provided on an opposite side to the pressure generating chamber in relation to the drive element; a driving circuit unit provided on an opposite side to the drive element in relation to the protective substrate, supplying an electric signal to the drive element; and a circuit connecting portion of the drive element, electrically connected to the driving circuit unit by the previously described device package structure.

Consequently, in this aspect of the invention, the driving circuit unit and the drive element arranged on the opposite sides in relation to the protective substrate are connected by the connector. Therefore even if the drive element is narrowed as the nozzle opening becomes narrower and the connection becomes extremely difficult by wirebonding, the connection hole can be readily narrowed, and the drive element and the driving circuit unit can be readily connected with a high connection reliability. Therefore a highly minute droplet ejection head can be provided.

Moreover, the space for leading out the wire, which is essential in a structure where both are connected by wirebonding, becomes unnecessary, and the droplet ejection head can be made thinner. Furthermore, a structure in which the driving circuit unit is packaged on the protective substrate can be employed. Therefore the structure is advantageous for thinning and miniaturizing the overall droplet ejection head including the driving circuit unit.

A sixth aspect of the invention provides a droplet ejection head including: a nozzle opening ejecting droplets; a pressure generating chamber communicating the nozzle opening; a drive element arranged outside of the pressure generating chamber, generating a pressure change in the pressure generating chamber; a protective substrate provided on an opposite side to the pressure generating chamber in relation to the drive element, having a through hole piercing through in the thickness direction, a driving circuit unit provided on an opposite side to the drive element in relation to the protective substrate, supplying an electric signal to the drive element, and a connector arranged in the through hole of the protective substrate, electrically connecting the driving circuit unit and a circuit connecting portion of the drive element.

According to this configuration, the driving circuit unit and the drive element arranged on opposite sides in relation to the protective substrate are connected by the connector. Therefore even if the drive element is narrowed as the nozzle opening becomes narrower and the connection becomes extremely difficult by wirebonding, the connection hole can be readily narrowed, and the drive element and the driving circuit unit can be readily connected with a high connection reliability. Therefore a highly minute droplet ejection head can be provided.

Moreover, the space for leading out the wire, which is essential in a structure where both are connected by wirebonding, becomes unnecessary, and the droplet ejection head can be made thinner. Furthermore, a structure in which the driving circuit unit is packaged on the protective substrate can be employed. Therefore the structure is advantageous for thinning and miniaturizing the overall droplet ejection head including the driving circuit unit.

It is preferable that, in the droplet ejection head of the sixth aspect of the invention, there be provided a plurality of the nozzle openings, and the pressure generating chambers and the drive elements which correspond to the respective nozzle openings, and the driving circuit unit and the respective drive elements be electrically connected by a connector arranged in the through hole in the protective substrate.

That is, this aspect of the invention may be particularly suitably used for a droplet ejection head in which a plurality of nozzle openings are formed in an array, and the pressure generating chambers and the drive elements corresponding to the respective nozzle openings are formed in an array.

It is preferable that, in the droplet ejection head of the sixth aspect of the invention, the connector include: a base member; and a terminal electrode piercing through the base member.

By using a connector including a terminal electrode piercing through the base member, the drive element and the driving circuit unit can be conducted in the through hole while avoiding contact of the terminal electrode with the protective substrate and the like. Therefore a droplet ejection head with a simple configuration and superior reliability can be obtained.

It is preferable that, in the droplet ejection head of the sixth aspect of the invention, a plurality of the connectors be arranged in laminations between a connection terminal of the driving circuit unit and a circuit connecting unit of the drive element.

According to this configuration, by adjusting the number of laminations of the connectors according to the thickness of the protective substrate, the position of the connection terminal of the driving circuit unit and the joining part of the connector can be adjusted. Therefore a droplet ejection head comprising a highly reliable conductive connection structure regardless of the thickness of the protective substrate can be obtained.

It is preferable that, in the droplet ejection head of the sixth aspect of the invention, the connector include: a first face; a second face of an opposite side of the first face; and a third face being difference of the first face and the second face. The terminal electrode of the connector includes: a first terminal electrode formed on the first face of the base member; a second terminal electrode formed on the second face of the base member; and a connection wiring formed on the third face of the base member, electrically connecting between the first terminal and the second terminal.

Also by this configuration, a package structure with a simple configuration and superior reliability can be obtained.

A seventh aspect of the invention provides a droplet ejection apparatus includes: the previously described droplet ejection head of the above-mentioned invention.

According to this configuration, there can be provided a droplet ejection apparatus including a droplet ejection head with a narrow nozzle pitch, whereby an image shape with high definition, and a microdevice shape can be formed satisfactorily by droplet ejection method.

A eighth aspect of the invention provides a device packaging method, including: preparing a base body having a conductive connection portion and a level difference portion; arranging a device having a connection terminal, on the base body; arranging a connector on the base body, the connector having substantially the same height as a height of the level difference portion formed between the connection terminal of the device and the conductive connection portion, when the device is arranged on the base body; electrically connecting the connector to the conductive connection portion; electrically connecting the connection terminal of the device to the connector; and electrically connecting the connection terminal and the conductive connection portion.

According to this device packaging method, since a connector having substantially the same height as the height of the level difference portion is arranged on the base body, and the conductive connection portion and the connection terminal are electrically connected, then the electrical connection between the device and the base body can be readily and reliably formed with a simple process. Moreover, even if there are a plurality of the connection terminals and a plurality of the conductive connection portions, they can be electrically connected altogether by the connector, and the device can be rapidly and efficiently packaged.

A ninth aspect of the invention provides a device packaging method, including: preparing a base body having a conductive connection portion and a level difference portion; arranging a device having a connection terminal, on the base body; arranging a connector on the base body, the connector having a height greater than a height of the level difference portion formed between the connection terminal of the device and the conductive connection portion, when the device is arranged on the base body; electrically connecting the connector to the conductive connection portion; electrically connecting the connection terminal of the device to the connector; and electrically connecting the connection terminal and the conductive connection portion.

According to this device packaging method, since a connector with a height greater than the height of the level difference portion is arranged on the base body, and the conductive connection portion and the connection terminal are electrically connected, then the electrical connection between the device and the base body can be readily and reliably formed with a simple process. In particular, since the connector is partially protruded from the level difference portion when the connector is arranged on the base body, there is an advantage in that the device can be more readily and reliably packaged on the connector. Moreover, even if there are a plurality of the connection terminals and a plurality of the conductive connection portions, they can be electrically connected altogether by the connector, and the device can be rapidly and efficiently packaged.

It is preferable that, in the device packaging method of the eighth aspect of the invention or the ninth aspect of the invention, further include: electrically connecting the connection terminal of the device to the conductive connection portion. Here, the conductive connection portion is flip chip packaged on the connection terminal of the device.

It is preferable that the, in device packaging method of the eighth aspect of the invention or the ninth aspect of the invention, further include: electrically connecting the connection terminal of the device to the terminal electrode of the connector. Here, the terminal electrode of the connector is flip chip packaged on the connection terminal of the device.

By employing the above flip chip packaging, the device can be readily packaged in a thin form, so that a device packaged body which is effective for miniaturizing and thinning electronic equipment can be obtained.

It is preferable that, in the device packaging method of the eighth aspect of the invention or the ninth aspect of the invention, the connector have: a base member; and a terminal electrode piercing through the base member, the conductive connection portion of the base body and the connection terminal of the device are electrically connected by the terminal electrode of the connector.

According to this device packaging method, by using the connector including the terminal electrode provided piercing through the base member, the connection terminal and the conductive connection portion can be electrically connected, while satisfactorily preventing a short-circuiting of the terminal electrode and other components on the base body.

It is preferable that, in the device packaging method of the eighth aspect of the invention or the ninth aspect of the invention further include: forming a connector laminated body having a plurality of the connectors laminated so as to electrically connect adjacent terminal electrodes of the connectors, and electrically connecting the conductive connection portion of the base body, and the connection terminal of the device by the terminal electrode of the connector.

By using the connector laminated body, the height of the connector can be readily matched to the level difference portion at an optional height, and even if the conductive connection portion and the connection terminal are arranged with a relatively large level difference portion, they can be electrically connected readily and reliably.

It is preferable that, in the device packaging method of the eighth aspect of the invention or the ninth aspect of the invention further include: using the connector including, a base member having a first face, a second face of an opposite side of the first face, a third face being difference of the first face and the second face, a first terminal electrode formed on the first face of the base member, a second terminal electrode formed on the second face of the base member, and a connection wiring formed on the third face of the base member, electrically connecting between the first terminal and the second terminal; electrically connecting the first terminal electrode and the conductive connection portion of the base body; electrically connecting the second terminal electrode and the connection terminal of the device; and electrically connecting the connection terminal and the conductive connection portion.

By this device packaging method, the connection terminal and the conductive connection portion can also be electrically connected readily and reliably.

A tenth aspect of the invention provides a method of manufacturing a semiconductor device, including packaging an electronic device using the device packaging method of the above-mentioned invention.

According to this manufacturing method, a semiconductor device having a package structure with superior electrical reliability can be readily manufactured.

It is preferable that the method of manufacturing a semiconductor device of the tenth aspect of the invention further include producing a connector including a base member and a terminal electrode piercing through the base member. The terminal electrode of the connector is formed by a method selected from a plating method, a transcription method, a dispensing method, a droplet ejection method, and a printing method.

According to this manufacturing method, a connector highly accurately formed with the terminal electrode can be manufactured at low cost, and therefore a semiconductor device with superior electrical reliability can be manufactured at low cost.

It is preferable that the method of manufacturing a semiconductor device of the tenth aspect of the invention further include: arranging a plurality of the connectors in laminations; and electrically connecting adjacent terminal electrodes of the connector so as to produce a connector laminated body. The conductive connection portion of the base body and the connection terminal of the electronic device, are electrically connected using the connector laminated body.

According to this manufacturing method, even if the connection terminal of the electronic device and the conductive connection portion of the base body are arranged with a relatively large size of the level difference portion, they can be electrically connected readily and reliably, and a semiconductor device with superior electrical reliability can be readily obtained.

It is preferable that the method of manufacturing a semiconductor device of the tenth aspect of the invention, further include producing a connector including, a base member having a first face, a second face of an opposite side of the first face, a third face being difference of the first face and the second face, a first terminal electrode formed on the first face of the base member, a second terminal electrode formed on the second face of the base member, and a connection wiring formed on the third face of the base member, electrically connecting between the first terminal and the second terminal. The first terminal electrode, the second electrode, and the connection wiring are formed by a method selected from a plating method, a dispensing method, a droplet ejection method, and a printing method.

According to this manufacturing method, a connector highly accurately formed with the terminal electrode can be manufactured at low cost, and therefore a semiconductor device with superior electrical reliability can be manufactured at low cost.

Moreover, according to this aspect of the invention, a droplet ejection head which is applicable to form an image with high definition and to produce a minute device having superior electrical reliability, a manufacturing method thereof, and a droplet ejection apparatus can be provided.

A eleventh aspect of the invention provides a connector including: a first terminal electrode; a second terminal electrode provided on the first terminal electrode via a level difference portion; and a connection wiring formed on the level difference portion, electrically connecting between the first terminal electrode and the second terminal electrode.

Consequently, in this aspect of the invention, when various devices such as a semiconductor element are packaged on the base body, if the connection terminal of the device, and the first conductive connection portions of the base body are separated via a level difference portion, then at least such a level difference portion can be eliminated with a very simple configuration. Consequently, in this aspect of the invention, the device can be packaged efficiently and reliably at low cost.

It is preferable that the connector of the eleventh aspect of the invention further include: an inclined-face between a face on which the first terminal electrode is formed, and a face on which the second terminal electrode is formed; and the connection wiring formed on the inclined-face.

As a result, in this aspect of the invention, the inclined-face intersects at an obtuse angle with respect to the face formed with the first terminal electrode and the face formed with the second terminal electrode. Therefore, it is possible to reduce the stress concentration applied to the connection wiring, and to avoid the occurrence of disconnection and the like. Moreover, for example, if a film is formed over the connection wiring by the droplet ejection method, it is possible to readily form a film, compared to a case where a film is formed over faces orthogonal to each other.

It is preferable that, in the connector of the eleventh aspect of the invention, the first terminal electrode be formed with a first conductive projected portion, the second terminal electrode be formed with a second conductive projected portion.

Here, the first conductive projected portion and the second conductive projected portion mean bumps. In this configuration, the difference in the height of the connector when the connector is packaged on the base body can be absorbed, and since the bumps can be formed when the first terminal electrode and the second terminal electrode, and the connection wiring are produced, manufacture is facilitated compared to the case where the bumps are formed on the base body.

It is preferable that the connector of the eleventh aspect of the invention further include a mark for detecting a position when the connector is packaged on the base body.

As a result, when the connector is packaged on the base body, by detecting the mark, it is possible to detect the position of the connector, and perform positioning with respect to the base body.

A twelfth aspect of the invention provides a device packaging method, including: preparing a base body having a first face, a level difference portion, a second face formed on the first face via the level difference portion, a first conductive connection portion formed on the first face; forming a second conductive connection portion;

arranging a connection terminal of a device on the second face, so as to connect the a connection terminal and the second conductive connection portion; electrically connecting the first conductive connection portion and the second conductive connection portion via a connector having a height at least substantially the same height as a height of the level difference portion; and connecting the first conductive connection portion and the connection terminal of the device.

Consequently, in the device packaging method according to this aspect of the invention: when various devices such as a semiconductor element are packaged on the base body, if the connection terminal of the device, and the first conductive connection portion of the base body are separated via a level difference portion, since a connector having at least the height of such a level difference portion is used, the level difference portion can be eliminated with a very simple configuration. Consequently, in the device package structure of this aspect of the invention, a device can be packaged efficiently and reliably at low cost. Moreover, in this aspect of the invention, by measuring the second conductive connection portion connected to the connection terminal of the device, it is possible to execute a condition check of the device before packaging the connector. It is preferable that, in the device packaging method of the twelfth aspect of the invention, further include: forming a first conductive projected portion on the device; forming a second conductive projected portion on the connector; electrically connecting the device and the base body via the first conductive projected portion; and electrically connecting the connector and the base body via the second conductive projected portion.

Here, the device and the connector are each flip chip packaged on the base body. As a result, in this aspect of the invention, it is possible to package the device and the connector by means of the same device (packaging device), contributing to an improvement in production efficiency.

BRIEF DESCRIPTION OF THE DRAWINGS

FIG. 7A is a cross-sectional view of a droplet ejection head according to a third embodiment.

FIG. 7B is a plan view of a droplet ejection head according to a third embodiment.

DESCRIPTION OF EXEMPLARY EMBODIMENTS

First Embodiment

Figure 1:
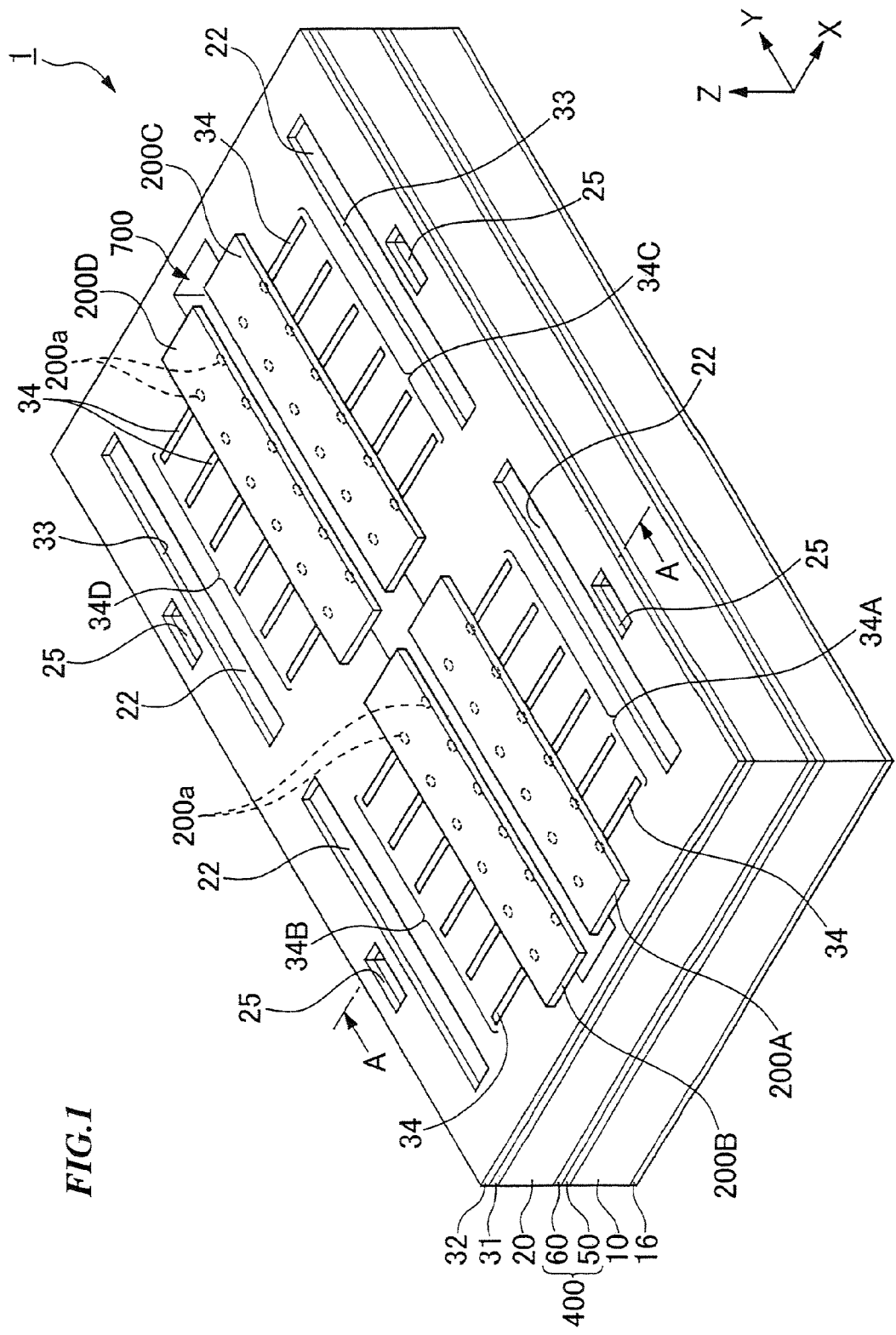
FIG. 1 is a schematic perspective view of a droplet ejection head according to a first embodiment.

Hereunder is a description of embodiments of this invention with reference to drawings. However, this invention is not limited to the following embodiments. Moreover, in the respective drawings referred to in the following description, for the sake of simplicity of the drawing, the dimensions of the respective components are modified and the respective components are partially omitted.

Droplet Ejection Head

Figure 2:
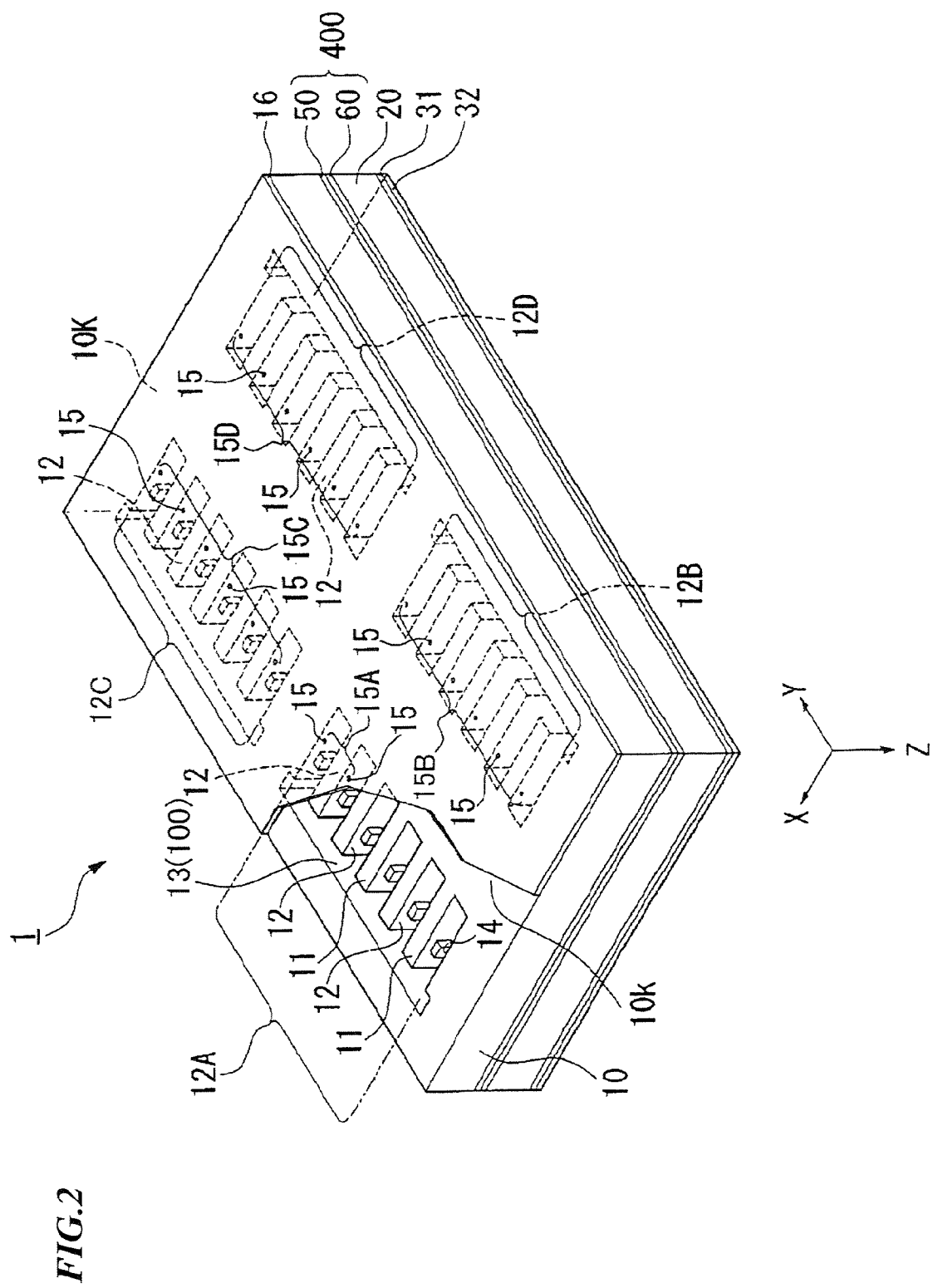
FIG. 2 is a schematic perspective view of the droplet ejection head according to the first embodiment, viewed from the bottom.
Figure 3:
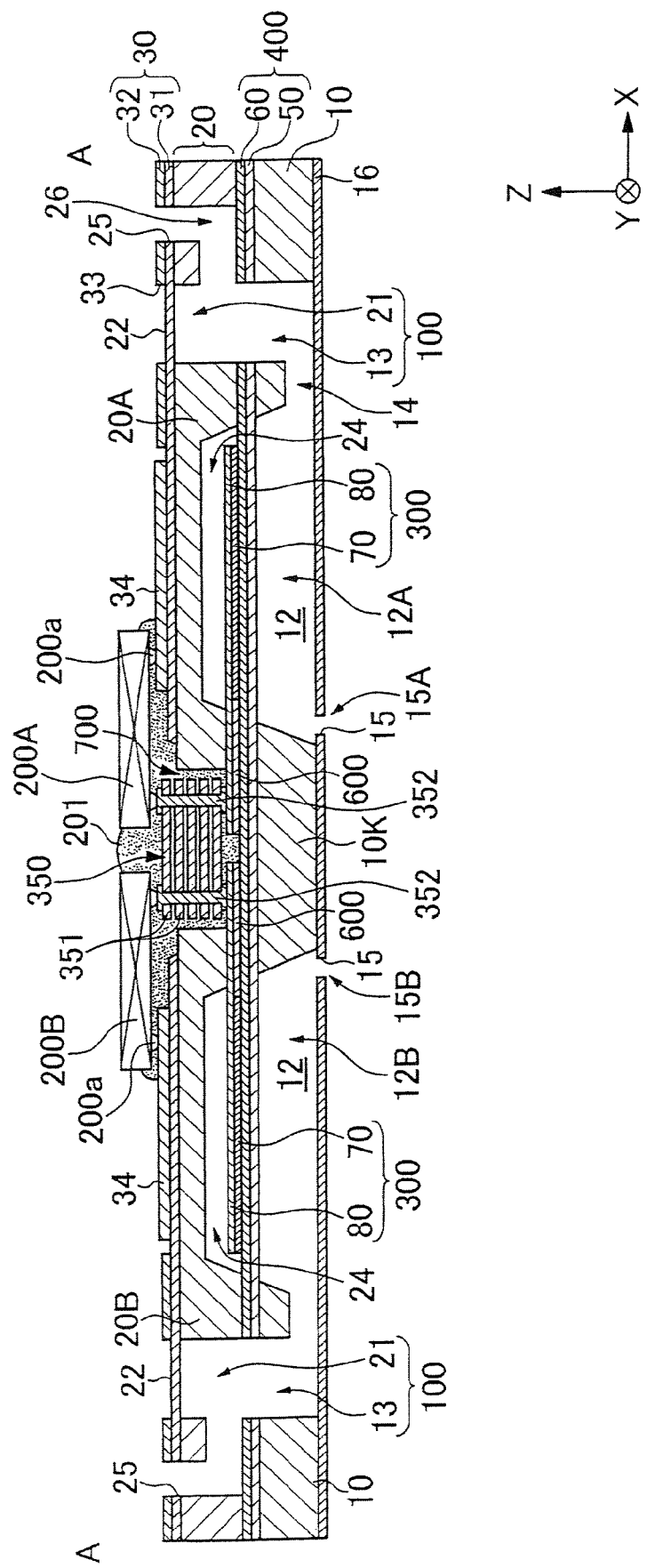
FIG. 3 is a cross-sectional view of the droplet ejection head taken along the line A-A shown in FIG. 1.

Firstly, as an embodiment of this invention, a droplet ejection head including a device package structure of this invention is described, with reference to FIG. 1 to FIG. 4. FIG. 1 is a schematic perspective view of an embodiment of the droplet ejection head. FIG. 2 is a partially exploded schematic perspective view of the droplet ejection head viewed from the bottom. FIG. 3 is a cross-sectional view of the droplet ejection head taken along the line A-A shown in FIG. 1.

In the following description, a XYZ rectangular coordinate system is set, and the positional relation of the respective members is described with reference to this XYZ rectangular coordinate system. A predetermined direction in the horizontal plane is set as an X axis direction, a direction which is orthogonal to the X axis direction in the horizontal plane is set as a Y axis direction, and a direction which is respectively orthogonal to the X axis direction and the Y axis direction (that is, a vertical direction) is set as a Z axis direction.

A droplet ejection head 1 of this embodiment is for ejecting an ink (functional liquid) in droplet form from a nozzle. As shown in FIG. 1 to FIG. 3, the droplet ejection head 1 is configured including: a nozzle substrate 16 which includes nozzle openings 15 through which droplets are ejected; a passage forming substrate 10 which is connected to the top face (+Z side) of the nozzle substrate 16 to form ink passages; a vibration plate 400 which is connected to the top face of the passage forming substrate 10 and is displaced by drive of piezoelectric elements (drive elements) 300; a reservoir forming substrate (protective substrate) 20 which is connected to the top face of the vibration plate 400 to form reservoirs 100; four driving circuit units (driver ICs) 200A to 200D for driving the piezoelectric elements 300, provided on the reservoir forming substrate 20; and a plurality of wiring patterns (conductive connection portions) 34 which are connected to the driving circuit units 200A to 200D.

The operation of the droplet ejection head 1 is controlled by an external controller (not shown) which is connected to the respective driving circuit units 200A to 200D. In the passage forming substrate 10 shown in FIG. 2, a plurality of opening regions in a substantial comb shape in plan view are formed in sections. Of these opening regions, parts which are formed extending in the X axis direction, are enclosed by the nozzle substrate 16 and the vibration plate 400 to form pressure generating chambers 12. Moreover, of these opening regions in a substantial comb shape in plan view, parts which are formed extending in the Y direction in the drawing, are enclosed by the reservoir forming substrate 20 and the passage forming substrate 10 to form reservoirs 100.

As shown in FIG. 2 and FIG. 3, the bottom face side (−Z side) of the passage forming substrate 10 in the drawing is opened, and the nozzle substrate 16 is connected to the bottom face of the passage forming substrate 10 so as to cover the opening. The bottom face of the passage forming substrate 10 and the nozzle substrate 16 are fixed via for example, an adhesive or a thermal heat setting film. The nozzle substrate 16 is provided with a plurality of nozzle openings 15 for ejecting droplets. Specifically, the plurality of nozzle openings 15 provided in the nozzle substrate 16 are arrayed in the Y axis direction, and in this embodiment a group of nozzle openings 15 arrayed in the plurality of regions in the nozzle substrate 16 respectively constitutes a first nozzle opening group 15A, a second nozzle opening group 15B, a third nozzle opening group 15C, and a fourth nozzle opening group 15D.

The first nozzle opening group 15A and the second nozzle opening group 15B are arranged opposite to each other in relation to the X axis direction. The third nozzle opening group 15C is provided to the +Y side of the first nozzle opening group 15A, and the fourth nozzle opening group 15D is provided to the +Y side of the second nozzle opening group 15B. The third nozzle opening group 15C and the fourth nozzle opening group 15D are arranged opposite to each other in relation to the X axis direction.

In FIG. 2, the respective nozzle opening groups 15A to 15D are shown as if they included six nozzle openings 15. However, the respective nozzle opening groups actually include a large number, for example about 720, of nozzle openings 15.

Inside of the passage forming substrate 10 is formed a plurality of partitions 11 which are extended from the center in the X direction. In the case of this embodiment, the passage forming substrate 10 is formed from silicon, and the plurality of partitions 11 are formed such that a silicon single crystal substrate serving as a basic material of the passage forming substrate 10 is partially removed by anisotropic etching. A plurality of spaces sectioned by the passage forming substrate 10 having the plurality of partitions 11, the nozzle substrate 16, and the vibration plate 400, are the pressure generating chambers 12.

The pressure generating chambers 12 and the nozzle openings 15 are formed to correspond to each other. That is, the plurality of pressure generating chambers 12 are provided in alignment in the Y axis direction so as to correspond to the plurality of nozzle openings 15 which constitute the respective first to fourth nozzle opening groups 15A to 15D. The plurality of pressure generating chambers 12 formed to correspond to the first nozzle opening group 15A constitutes a first pressure generating chamber group 12A. The plurality of pressure generating chambers 12 formed to correspond to the second nozzle opening group 15B constitutes a second pressure generating chamber group 12B. The plurality of pressure generating chambers 12 formed to correspond to the third nozzle opening group 15C constitutes a third pressure generating chamber group 12C. The plurality of pressure generating chambers 12 formed to correspond to the fourth nozzle opening group 15D constitutes a fourth pressure generating chamber group 12D.

The first pressure generating chamber group 12A and the second pressure generating chamber group 12B are arranged opposite to each other in relation to the X axis direction, and a partition 10K is formed therebetween. Similarly, a partition 10K is formed between the third pressure generating chamber group 12C and the fourth pressure generating chamber group 12D, and they are arranged opposite to each other in relation to the X axis direction.

The ends of the plurality of pressure generating chambers 12 forming the first pressure generating chamber group 12A, on the substrate center side (−X side) are blocked by the partition 10K, while the other ends on the substrate periphery side (+X side) are gathered together so as to be connected to each other, and are connected to the reservoir 100. The reservoir 100 is for temporarily holding the functional liquid between the functional liquid inlet 25 and the pressure generating chamber 12 shown in FIG. 1 and FIG. 3, and includes a reservoir portion 21 formed in a rectangular form in plan view extending in the Y axis direction in the reservoir forming substrate 20, and a communicating portion 13 formed in a rectangular form in plan view extending in the Y axis direction in the passage forming substrate 10. Through the communicating portion 13, the reservoir portion 21 is connected to the respective pressure generating chambers 12 to form a functional liquid holding chamber (ink chamber), that is common to the plurality of pressure generating chambers 12 constituting the first pressure generating chamber group 12A. Taking a look of the route of the functional liquid shown in FIG. 3, it is designed such that the functional liquid introduced from the functional liquid inlet 25, which is opened in the top face on the outer end of the head, flows through an introduction path 26 into the reservoir 100, so as to be supplied through a supply path 14 into the respective plurality of pressure generating chambers 12 constituting the first pressure generating chamber group 12A.

Moreover, the respective pressure generating chambers 12 which respectively constitute the second, third, and fourth pressure generating chamber groups 12B, 12C, and 12D are connected to reservoirs 100 having a similar structure to the above, and constitute a temporary storage portion for the functional liquid which is respectively supplied to the pressure generating chamber groups 12B to 12D communicated through the supply path 14.

The vibration plate 400 arranged between the passage forming substrate 10 and the reservoir forming substrate 20 includes a structure having an elastic film 50 and a lower electrode film 60 sequentially laminated from the passage forming substrate 10 side. The elastic film 50 arranged on the passage forming substrate 10 side is made from for example a silicon oxide film having a thickness of about 1 μm to 2 μm. The lower electrode film 60 formed on the elastic film 50 is made from for example a metal film having a thickness of about 0.2 μm. In this embodiment, the lower electrode film 60 is designed to also function as a common electrode of the plurality of piezoelectric elements 300 arranged between the passage forming substrate 10 and the reservoir forming substrate 20.

As shown in FIG. 3, the piezoelectric element 300 for deforming the vibration plate 400 includes a structure having a piezoelectric film 70 and an upper electrode film 80 sequentially laminated from the lower electrode film 60 side. The thickness of the piezoelectric film 70 is for example about 1 μm. The thickness of the upper electrode film 80 is for example about 0.1 μm.

As a concept of the piezoelectric element 300, in addition to the piezoelectric film 70 and the upper electrode film 80, it may include the lower electrode film 60. This is because the lower electrode film 60 functions as the piezoelectric element 300 and also functions as the vibration plate 400. In this embodiment, there is employed a configuration in which the elastic film 50 and the lower electrode film 60 function as the vibration plate 400. However the configuration may be such that the elastic film 50 is omitted, and the lower electrode film 60 has both functions of itself and as an elastic film (50).

The plurality of piezoelectric elements 300 (the piezoelectric films 70 and the upper electrode films 80) are provided so as to respectively correspond to the plurality of nozzle openings 15 and pressure generating chambers 12. In this embodiment, for the sake of expedience, a group of the plurality of piezoelectric elements 300 provided in alignment in the Y axis direction so as to respectively correspond to the nozzle openings 15 which constitute the first nozzle opening group 15A, is called a first piezoelectric element group. Similarly, a group of the plurality of piezoelectric elements 300 provided in alignment in the Y axis direction so as to respectively correspond to the nozzle openings 15 which constitute the second nozzle opening group 15B, is called a second piezoelectric element group. Furthermore, a group of the plurality of piezoelectric elements 300 corresponding to the third nozzle opening group 15C, is called a third piezoelectric element group, and a group of the plurality of piezoelectric elements 300 corresponding to the fourth nozzle opening group 15D, is called a fourth piezoelectric element group.

In the planar region on the passage forming substrate 10, the first piezoelectric element group and the second piezoelectric element group are arranged opposite to each other in relation to the X axis direction. Similarly, the third and fourth piezoelectric element groups which respectively correspond to the third and fourth nozzle opening groups 15C and 15D are arranged opposite to each other in relation to the X axis direction.

The reservoir forming substrate 20 is provided covering the region in the vibration plate 400 including the piezoelectric elements 300. The top face of the reservoir forming substrate 20 (the opposite face to the passage forming substrate 10) is joined with a compliance substrate 30 of a structure having a sealing film 31 and a fixing plate 32 laminated. The sealing film 31 arranged inside of this compliance substrate 30 is made from a less rigid and flexible material (for example, a polyphenylenesulfide film having a thickness of about 6 μm). By this sealing film 31, the top of the reservoir portion 21 is sealed. On the other hand, the fixing plate 32 arranged on the outside is a plate member made from a rigid material such as a metal (for example, a stainless steel having a thickness of about 30 μm).

The fixing plate 32 is formed with openings 33 by cutting out the planar regions corresponding to the reservoirs 100. Due to this configuration, the top of the reservoir 100 is sealed by the flexible sealing film 31 only, forming a flexible portion 22 that is deformable by the change of the internal pressure.

Normally, when the functional liquid is supplied from the functional liquid inlet 25 to the reservoir 100, the pressure is changed in the reservoir 100, for example, due to the flow of the functional liquid at the time of driving the piezoelectric element 300, or the ambient heat. However, as described above, since the top of the reservoir 100 has the flexible portion 22 which is sealed by the sealing film 31 only, the flexible portion 22 bends and deforms to absorb the change of pressure. Consequently, the inside of the reservoir 100 is always maintained at a constant pressure. Other parts are maintained at a sufficient strength by the fixing plate 32. On the compliance substrate 30 outside of the reservoir 100 is formed a functional liquid inlet 25 for supplying the functional liquid to the reservoir 100. The reservoir forming substrate 20 is provided with an introduction path 26 through which the functional liquid inlet 25 and the side wall of the reservoir 100 are communicated.

Since the reservoir forming substrate 20 is a member for forming the base body of the droplet ejection head 1 together with the passage forming substrate 10, it is preferably a rigid body. As a material for forming the reservoir forming substrate 20, it is more preferred to use a material having substantially the same coefficient of thermal expansion as that of the passage forming substrate 10. In the case of this embodiment, since the passage forming substrate 10 is made from silicon, a silicon single crystal substrate of the same material thereof is suitable. If the silicon single crystal substrate is used, it is possible to apply a highly precise treatment more readily than with anisotropic etching. Therefore an advantage can be obtained in that piezoelectric element holding portions 24 and a slot (through hole) 700 can be readily formed. In addition, similarly to the passage forming substrate 10, the reservoir forming substrate 20 can be made using a glass, a ceramic material, and the like.

As shown in FIG. 1, on the reservoir forming substrate 20 is arranged the four driving circuit units 200A to 200D. The driving circuit units 200A to 200D are configured by including, for example a semiconductor integrated circuit (IC) including a circuit board or a driving circuit. Each driving circuit unit 200A to 200D includes a plurality of connection terminals 200a on the bottom face side in the drawing. The connection terminals 200a of one part of the driving circuit units 200A to 200D are connected to the wiring pattern 34 formed on the reservoir forming substrate 20. As shown in FIG. 3, the connection terminals 200a of the other part of the driving circuit units 200A to 200D are connected to the terminal electrodes 352 of the connector laminated body 350 arranged in the slot of the reservoir forming substrate 20.

The driving circuit units 200A and 200C are arranged longitudinally along the Y axis direction on the reservoir forming substrate 20. The driving circuit units 200B and 200D are arranged substantially in parallel to the driving circuit units 200A and 200C respectively, and longitudinally along the Y axis direction. The wiring patterns 34 electrically connected to the respective driving circuit units 200A to 200D are all extended from the ends of the driving circuit units 200A to 200D in the X axis direction, and the tips thereof can be used as connection terminals to an external controller.

In the case of this embodiment, a group of wiring patterns 34 (six in the drawing) which are electrically connected to the piezoelectric elements 300 of the first piezoelectric element group corresponding to the first nozzle opening group 15A, constitutes a first wiring group 34A. A group of wiring patterns 34 which are electrically connected to the piezoelectric elements 300 of the second piezoelectric element group corresponding to the second nozzle opening group 15B, constitutes a second wiring group 34B. Moreover, similarly groups of wiring patterns 34 which are electrically connected to the piezoelectric elements 300 of the third and fourth piezoelectric element groups, respectively constitute a third wiring group 34C and a fourth wiring group 34D.

The group of the wiring patterns 34 constituting the first wiring group 34A are connected to the driving circuit unit 200A. The group of the wiring patterns 34 constituting the second wiring group 34B are connected to the driving circuit unit 200B. The group of the wiring patterns 34 constituting the third wiring group 34C are connected to the driving circuit unit 200C. The group of the wiring patterns 34 constituting the fourth wiring group 34D are connected to the driving circuit unit 200D. In the droplet ejection head 1 of this embodiment, there is employed a configuration in which the first piezoelectric element group to the fourth piezoelectric element group respectively corresponding to the first nozzle opening group 15A to the fourth nozzle opening group 15D are driven by respectively different driving circuit units 200A to 200D.

In FIG. 1, there is employed a configuration in which each wiring group has six wiring patterns 34. However, this is so that it does not exceed the total shown in the figure for the number of the nozzle openings 15 and the number of the pressure generating chambers 12 shown in FIG. 2. As described above, since the wiring patterns 34 included in the respective wiring groups 34A to 34D constitute connection wirings between the driving circuit units 200A to 200D and the external controller, the number thereof is sufficient if it is a necessary number for drive control of the driving circuit units 200A to 200D, and normally it is less than the number of the piezoelectric elements 300 driven by the respective driving circuit units.

As shown in FIG. 1, in the center in relation to the X axis direction of the reservoir forming substrate 20 is formed a slot (through hole) 700 extending in the Y axis direction. That is, in the droplet ejection head of this embodiment, this slot 700 forms a level difference portion which separates the upper electrode films 80 (circuit connecting unit) of the piezoelectric elements 300, and the connection terminals 200a of the driving circuit units 200A to 200D that are to be connected thereto.

In this embodiment, as shown in FIG. 3, a part of the reservoir forming substrate 20 sectioned in relation to the X axis direction by the slot 700, which seals the plurality of piezoelectric elements 300 connected to the circuit driving units 200A is called a first sealing portion 20A. A part which seals the plurality of piezoelectric elements 300 connected to the driving circuit unit 200B is called a second sealing portion 20B. In regions of these first sealing portion 20A and second sealing portion 20B which respectively face to the piezoelectric elements 300 are provided piezoelectric element holding portions (element holding portions) 24 which maintain spaces of a degree such as to not interfere with the motion of the piezoelectric elements 300, and which seal the spaces. In the piezoelectric element 300, at least the piezoelectric film 70 is sealed within the piezoelectric element holding portion 24.

Moreover, similarly, if a part of the reservoir forming substrate 20 which seals the plurality of piezoelectric elements 300 connected to the circuit driving units 200C is called a third sealing portion, and a part of the reservoir forming substrate 20 which seals the plurality of piezoelectric elements 300 connected to the driving circuits 200D is called a fourth sealing portion, then in these third sealing portion and fourth sealing portion are also respectively provided piezoelectric element holding portions which maintain spaces of a degree such as to not interfere with the motion of the piezoelectric elements 300, and which seal the spaces.

In the case of this embodiment, the piezoelectric element holding portions (24) which are respectively provided for the first to fourth sealing portions have a dimension that allows sealing of the overall piezoelectric elements 300 included in the respective piezoelectric element groups, and form concavities in a substantial rectangular shape in plan view extending in the orthogonal direction to the sheet of FIG. 3. Each piezoelectric element holding portion may be sectioned by the respective piezoelectric elements 300.

As shown in FIG. 3, of the piezoelectric elements 300 sealed by the piezoelectric element holding portions 24 of the first sealing portion 20A, the ends of the upper electrode films 80 on the −X side are extended to the outside of the first sealing portion 20A and exposed to the bottom face of the slot 700. If a part of the lower electrode film 60 is arranged on the passage forming substrate 10 in the slot 700, a nonconductive film 600 for preventing a short-circuit between the upper electrode films 80 and the lower electrode film 60 is inserted between the upper electrode films 80 and the lower electrode film 60. Similarly, in the piezoelectric element 300 sealed by the piezoelectric element holding portions 24 of the second sealing portion 20B, the ends of the upper electrode films 80 on the +X side are extended to the outside of the second sealing portion 20B and exposed to the inside of the slot 700, and a nonconductive film 600 is inserted between the upper electrode films 80 and the lower electrode film 60. Moreover, although not shown, in the piezoelectric element 300 sealed by the third and fourth sealing portions, a part of the upper electrode films 80 thereof are extended to the outside of the third and fourth sealing portions and exposed to the inside of the slot 700.

Moreover, in the slot 700, a connector laminated body 350 is arranged and positioned on the upper electrode films 80 of the respective piezoelectric elements 300 that have been exposed to the bottom face of the slot 700. In the droplet ejection head 1 of this embodiment, by means of this connector laminated body 350, the level difference portion between the bottom face of the slot 700 and the top face of the reservoir forming substrate 20 on which the driving circuit units 200A to 200D are arranged is eliminated, and the driving circuit units 200A to 200D are packaged on the reservoir forming substrate 20 in a planar manner.

Figure 4A:
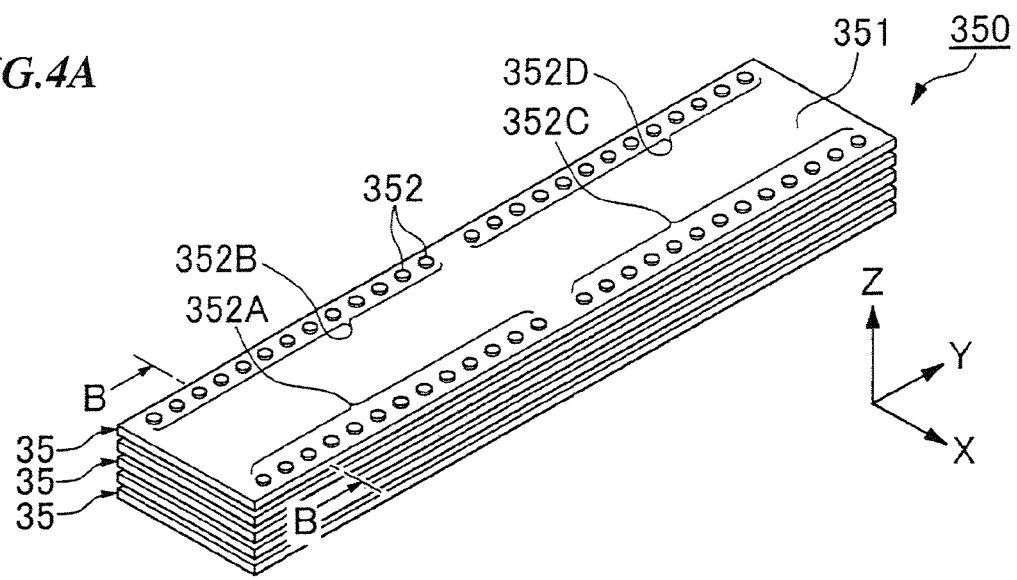
FIG. 4A is a schematic perspective view of a connector shown in FIG. 3.
Figure 4B:
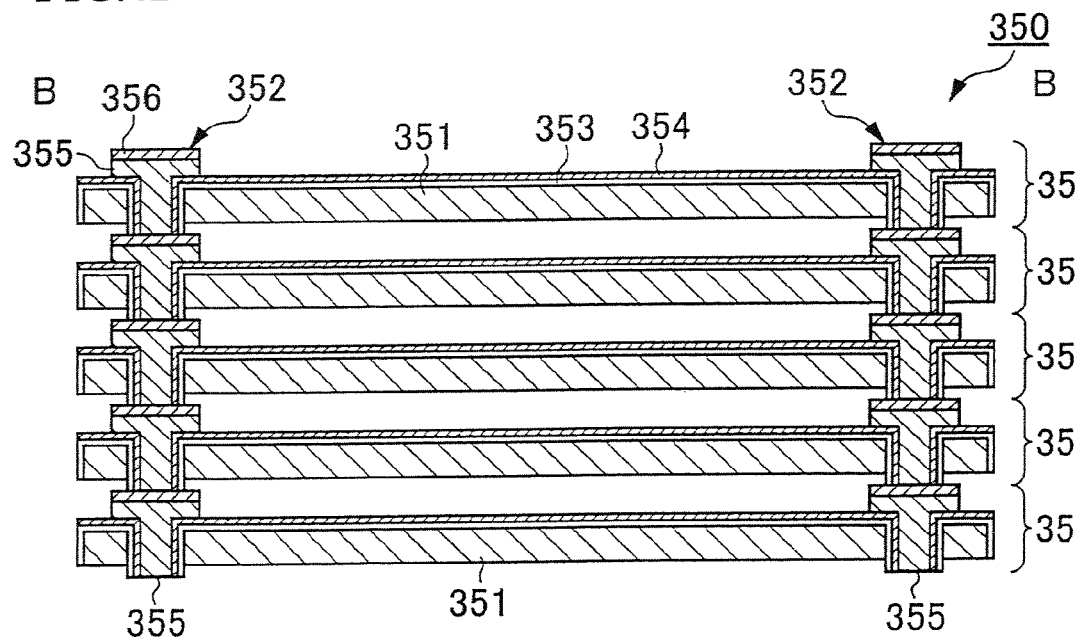
FIG. 4B is a cross-sectional view of the connector taken along the line B-B shown in FIG. 4A.

FIG. 4A is a schematic perspective view of the connector laminated body 350 shown in FIG. 3. FIG. 4B is cross-sectional view of the connector taken along the line B-B shown in FIG. 4A. The connector laminated body 350 according to this embodiment is made by electrically connecting and laminating a plurality of (five in the drawing) plate-like connectors 35 to each other. Each connector 35 is configured including a connector substrate (base member) 351 and a plurality of terminal electrodes (through electrodes) 352 which pass through the connector substrate 351. As shown in FIG. 4A, the terminal electrodes 352 are formed in an array along the long sides of the connector substrate 351.

In this embodiment, of the terminal electrodes 352 arrayed along the long side on the +X side of the connector substrate 351, a group of the terminal electrodes 352 arrayed to the −Y side constitutes a first terminal electrode group 352A, while a group of the terminal electrodes 352 arrayed to the +Y side constitutes a third terminal electrode group 352C. Moreover, of the terminal electrodes 352 arrayed along the long side on the −X side of the connector substrate 351, a group of the terminal electrodes 352 arrayed to the −Y side constitutes a second terminal electrode group 352B, while a group of the terminal electrodes 352 arrayed to the +Y side constitutes a fourth terminal electrode group 352D. The first terminal electrode group 352A is a set of the terminal electrodes 352 that are to be connected to the respective piezoelectric elements 300 included in the first piezoelectric element group described above. The second terminal electrode group 352B is a set of the terminal electrodes 352 that are to be connected to the respective piezoelectric elements 300 included in the second piezoelectric element group. Moreover, similarly, the third terminal electrode group 352C and the fourth terminal electrode group 352D respectively correspond to the third piezoelectric element group and the fourth piezoelectric element group.

In the connector laminated body 350 shown in FIG. 4A, a larger number of the terminal electrodes 352 than that of the connection terminals 200a shown in FIG. 1 are shown. However, in these drawings a smaller number of the connection terminals 200a and the terminal electrodes 352 are shown in order to ensure visibility of the drawings. In the actual droplet ejection head, the number of the terminal electrodes 352, the number of the piezoelectric elements 300, and the number of the connection terminals 200a are matched. That is, since about 720 of the piezoelectric elements 300 are provided per each piezoelectric element group, then actually 720 of the terminal electrodes 352 connected to the respective piezoelectric elements 300 are provided per each terminal electrode group.

By taking a look of the cross-sectional structure shown in FIG. 4B, on the surface of the connector substrate 351 constituting the connector 35 is formed a nonconductive layer 353 and a foundation layer 354 by lamination. The connector substrate 351 is for example a silicon substrate having a thickness of about 50 μm. The nonconductive layer 353 is for example silicon oxide. The foundation layer 354 may be a lamination of for example a barrier layer made from TiW and a seed layer made from Cu.

The terminal electrode 352 is configured including; metal terminals 355 in a substantial letter-T shape in the cross-sectional view, with a part inserted into a through hole 351a having an inner face laminated by the nonconductive layer 353 and the foundation layer 354, and a joining layer 356 formed on the top face of the metal terminal 355. The metal terminal 355 is made from for example Cu formed by using a plating method. The joining layer 356 is for example a brazing filler metal such as leadless solder. The terminal electrode 352 is formed so that the respective parts protrude from the opposite faces of the connector substrate 351, and the height of the protrusions is for example about 20 μm. Consequently, the thickness of the connector 35 becomes about 70 μm.

Moreover, the connector laminated body 350 includes a configuration in which a plurality of connectors 35 are laminated in substantially the same position in plan view, and the extremities of the metal terminals 355 arranged on the upper layer side (+Z side) and protruding to the bottom face side of the connectors 35 in the drawing, are joined and electrically connected to the joining material 356 of the connector 35 arranged on the lower layer side (−Z side).

In the case of this embodiment, the height of the connector laminated body 350 including the laminated structure is substantially matched the depth of the slot 700, so that, by arranging such a connector laminated body 350 into the slot 700, the terminal electrodes 352 provided on the most top face of the connector laminated body 350, and the wiring pattern 34 provided on the top face of the reservoir forming substrate 20 are arranged in substantially the same position in the XY plane. In such a configuration, the driving circuit units 200A to 200D, and the plurality of piezoelectric elements 300 corresponding to the respective driving circuit units are electrically connected via the connector laminated body 350, so that the piezoelectric elements 300 are driven by the respective driving circuit units 200A to 200D.

In this embodiment, the description was about the connector laminated body 350 having five connectors 35 laminated. However, the number of laminations of the connectors 35 may be suitably modified according to the height of the level difference portion (the depth of the slot 700 in this embodiment) provided for the connector laminated body 350 for use. Since the thickness per one connector 35 is about 70 μm, if the height of the level difference portion is about 200 μm, a connector laminated body having three connectors 35 laminated may be used.

Moreover, in the case of this embodiment, as shown in FIG. 3, the configuration is such that the upper electrode film 80 of the piezoelectric element 300 is led out to the outside of the piezoelectric element holding portion 24 and exposed to the inside of the slot 700, and the terminal electrode 352 of the connector laminated body 350 is electrically connected to the exposed part. Consequently, the upper electrode film 80 forms a circuit connecting unit of the piezoelectric element 300.

The configuration may be such that electrode wiring that has been electrically connected to the upper electrode film 80 is formed on the passage forming substrate 10, and this electrode wiring is led out to the outside of the piezoelectric element holding portion 24 and electrically connected to the connector laminated body 350. In this case, the electrode wiring that has been electrically connected to the upper electrode film 80 constitutes the circuit connecting unit of the piezoelectric element 300.

Here, the conductive connection structure between the terminal electrode 352 and the piezoelectric element 300 (upper electrode film 80) may be made by using a brazing filler metal, an anisotropic conductive material including an anisotropic conductive film (ACF) or an anisotropic conductive paste (ACP), or an insulative resin material including a non conductive film (NCF) or a non conductive paste (NCP).

Moreover, regarding the flip chip packaging of the driving circuit units 200A to 200D with respect to the terminal electrodes 352 on the top face of the connector laminated body 350, and the wiring patterns 34, there may be employed a conductive connection structure using a brazing filler metal, an anisotropic conductive material including an anisotropic conductive film or an anisotropic conductive paste, or an insulative resin material including a non conductive film or a non conductive paste. In this embodiment, in particular, as a connection terminal 200a provided for the driving circuit units 200A to 200D, a bump made from Au or a bump made from a resin core that is covered with a metal film, is preferably used. With the driving circuit units 200A to 200D using these bumps for the connection terminal 200a, the bump is readily deformed when the connection terminal 200a is pushed against the terminal electrode 352 and the wiring pattern 34. Therefore, for example, even if the position of the terminal electrode 352 in the Z axis direction is displaced from the position which is the same as the wiring pattern 34 on the plane due to the difference in the height of the connector laminated body 350, the displacement can be absorbed by the deformation of the bump, enabling to join the connection terminal 200a and the terminal electrode 352 or the wiring pattern 34.

Furthermore, in order to improve the easiness and the reliability of such a conductive connection, a positioning mechanism of the connector laminated body 350 and the slot 700 (upper electrode film 80) may be provided. As such a positioning mechanism, for example, there may be employed a mechanism where a convex portion is provided for the connector laminated body 350 so that the convex portion is engaged with a concavity provided for the side wall of the slot 700 to position them.

In this manner, in the droplet ejection head 1 of this embodiment, the connector laminated body 350 having substantially the same height as the thickness of the reservoir forming substrate 20 is arranged in the slot 700 that has been provided for the reservoir forming substrate 20, and the connector laminated body 350 is connected to the circuit connecting unit (upper electrode film 80) of the piezoelectric element 300 that has been extended from the piezoelectric element holding portion 24 to be exposed to the inside of the slot 700. Moreover, the driving circuit units 200A to 200D are packaged with respect to the terminal electrodes 352 that have been provided on the top face of the connector laminated body 350 at substantially the same height as that of the top face of the reservoir forming substrate 20. As a result, in the droplet ejection head 1 of this embodiment, the space where the wire is led out in such a structure where the driving circuit unit and the piezoelectric element are connected by wirebonding, becomes unnecessary, and the droplet ejection head 1 can be made thinner. Moreover, since the slot 700 is filled by the connector laminated body 350, the rigidity of the droplet ejection head 1 itself can be increased, and the decrease in the accuracy of ejection due to warping and the like can be effectively prevented.

Moreover, even in the case where the pitch of the piezoelectric elements 300 becomes narrower, with narrowing of the pitch of the nozzle openings 15, so that it is extremely difficult to perform wirebonding, the driving circuit units 200A to 200D and the piezoelectric elements 300 can be electrically connected with ease. That is, as described in the later mentioned manufacturing method, the terminal electrode 352 of the connector 35 constituting the connector laminated body 350 can be formed to an accurate dimension at an accurate position. Therefore, even if the pitch of the nozzle openings 15 is narrowed, it is possible to produce a terminal electrode which can be accurately positioned with respect to the piezoelectric elements 300 arranged at a narrow pitch according to the nozzle pitch. Consequently, according to this embodiment, it is possible to obtain a droplet ejection head 1 which can form an image with high definition, and form a pattern of a functional film.

In the droplet ejection head 1 of this embodiment, the reservoir forming substrate 20 is also designed to function as a sealing member which blocks the piezoelectric elements 300 from the external environment to seal the piezoelectric elements 300. By sealing the piezoelectric elements 300 by the reservoir forming substrate 20, deterioration in the properties of the piezoelectric elements 300 due to the external environment such as moisture and the like can be prevented. Moreover, in this embodiment, the inside of the piezoelectric element holding portion 24 is only sealed. However there may be employed a structure in which for example, the space in the piezoelectric element holding portion 24 is evacuated, or made a nitrogen or argon atmosphere, or the like, to thereby maintain the inside of the piezoelectric element holding portion 24 at a low humidity. By such a structure, deterioration in the piezoelectric elements 300 can be further effectively prevented.

In order to eject droplets of the functional liquid by the droplet ejection head 1 having the above structure, an external functional liquid supplying device (not shown) connected to the functional liquid inlet 25 is driven by an external controller (not shown) connected to the droplet ejection head 1. The functional liquid sent out from the external functional liquid supplying device is supplied through the functional liquid inlet 25 to the reservoir 100, and then filled into the internal passage up to the nozzle openings 15.

Moreover, the external controller sends the driving power or the command signal to the driving circuit unit 200 and the like packaged on the reservoir forming substrate 20. The driving circuit unit 200 that has received the command signal or the like, sends the command signal based on the command from the external controller, through the wiring pattern 34, the pad 35, conductive member 36, and so on, to the respective piezoelectric elements 300 that are conductively connected.

Then, a voltage is applied between the respective lower electrode films 60 and upper electrode films 80 corresponding to the pressure generating chambers 12, resulting in displacement of the elastic film 50, the lower electrode film 60, and the piezoelectric film 70. Due to this displacement, the volume of the respective pressure generating chambers 12 is changed, increasing the internal pressure, to eject droplets from the nozzle openings 15.

Method of Manufacturing Droplet Ejection Head

Next is a description of a method of manufacturing the droplet ejection head 1, with reference to the cross-sectional process diagram of FIG. 5.

Hereunder, the main description is about the method of manufacturing the connector laminated body 350 used for electrically connecting the driving circuit unit 200 and the piezoelectric element 300, and a process for connecting them using the connector laminated body 350. It is assumed that, the manufacture, connection, and arrangement of the nozzle substrate 16, the passage forming substrate 10, the reservoir forming substrate 20, the piezoelectric elements 300, and the like in the droplet ejection head 1 are already completed.

Production of Connector Laminated Body

First is a description of the step for producing the connector laminated body 350, with reference to FIG. 5. As shown in FIG. 5A, for example, a silicon substrate 351A for a connector having a thickness of about 500 μm is prepared, and on the overall surface thereof a nonconductive layer 353 is formed by a method of thermal oxidation and the like. In the case of this embodiment, the nonconductive layer 353 is a silicon oxide film.

Figure 5A:
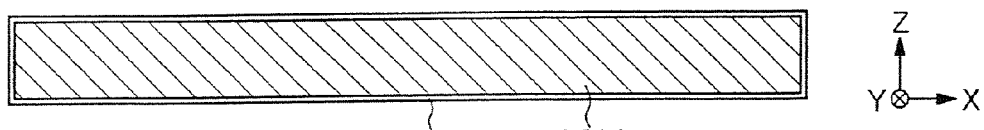
FIG. 5A to 5G are cross-sectional views of process diagram showing an example of level difference portions for manufacturing a connector.
Figure 5B:
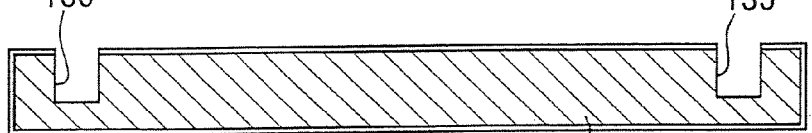

Next, as shown in FIG. 5B, holes 135 for forming the metal terminals are formed in the connector silicon substrate 351A. These holes 135 are formed to have a predetermined opening diameter and depth, using a well-known photolithography technique. The opening diameter is for example about 50 μm, and the depth is appropriately modified according to the length of the terminal electrode 352 to be formed. In the connector 35 shown in FIG. 3, the thickness of the thin-layered connector substrate 351 is about 70 μm, and the length of the terminal electrode 352 protruded from the connector substrate 351 is about 20 μm. Therefore the depth of the hole 135 is about 90 μm.

Figure 5C:
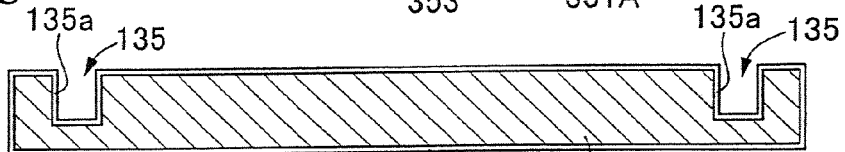

Next, as shown in FIG. 5C, a nonconductive film 135a which covers the inner face of the hole 135 made in the above level difference portion, is formed. The nonconductive film 135a is a silicon oxide film formed for example by a method of directly oxidizing the surface of the silicon substrate exposed on the inner face of the hole 135, such as a thermal oxidation method or a plasma CVD technique using TEOS (tetraethoxysilane) for a raw material gas. The nonconductive film 135a is provided to prevent current leakage from the terminal electrode 352 to the connector substrate 351, deterioration of the connector substrate 351 due to oxygen or moisture, and the like.

Figure 5D:
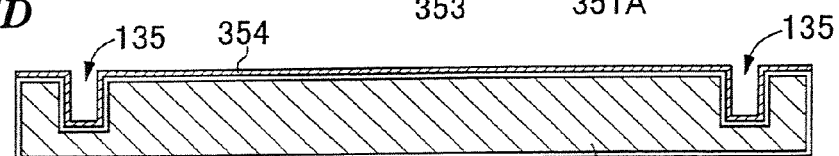

As shown in FIG. 5D, on the surface of the connector silicon substrate 351A formed with the holes 135, a foundation layer 354 is formed using a sputter technique, a vacuum evaporation method, or the like. In the case of this embodiment, the foundation layer 354 is a laminated film having a barrier layer and a seed layer sequentially laminated from the connector silicon substrate 351A side. The barrier layer is for example made from TiW, and the seed layer is made from Cu. As shown in the drawing, the foundation layer 354 is continually formed over the connector silicon substrate 351A, so as to cover the side wall and the bottom wall of the hole 135. The thickness of the barrier layer is about 100 nm, and the thickness of the seed layer is about several 100 nm.

Figure 5E:
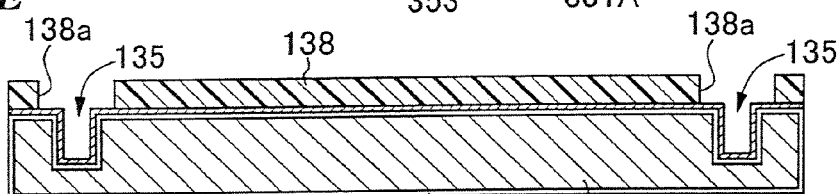

As shown in FIG. 5E, a plating resist is applied on the connector silicon substrate 351A, and this plating resist is patterned, to thereby form a plating resist pattern 138 having openings 138a for forming the terminal electrodes 352. In this embodiment, the openings 138a are formed larger than the opening diameter of the hole 135.

Figure 5F:
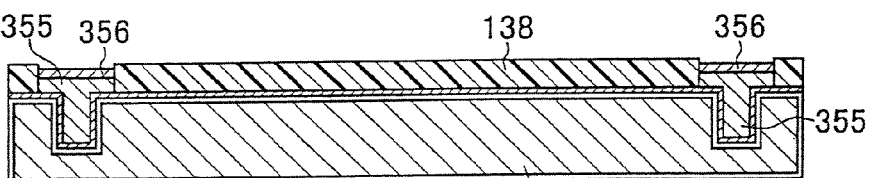

Next, as shown in FIG. 5F, a Cu electrolytic plating is performed to embed Cu (copper) into the holes 135 in the connector silicon substrate 351A, and the openings 138a in the plating resist pattern 138, so as to form metal terminals 355 serving as the through electrodes. Then, by using the plating resist pattern 138 as it is as a mask, joining materials 356 made from a brazing filler metal such as a leadless solder are selectively formed on the metal terminals 355. This joining material 356 is to connect the layers when a plurality of formed connectors 35 are laminated. The joining materials 356 may be formed after peeling off the plating resist pattern 138. By the above level difference portion, the terminal electrodes 352 including the metal terminals 355 and the joining materials 356 can be formed on the connector silicon substrate 351A.

Figure 5G:
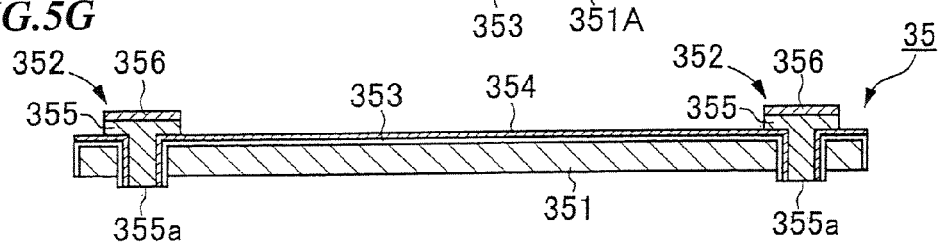

Next, the plating resist pattern 138 is peeled off from the silicon substrate 351A. Then as shown in FIG. 5G the connector silicon substrate 351A is etched from the bottom face side in the drawing, so as to thin the layer to a thickness of about 50 μm to 70 μm to make the connector substrate 351. By this layer-thinning level difference portion, a part of the terminal electrode 352 is protruded from the bottom face of the connector substrate 351 in the drawing. Moreover, at this time, the surface of the metal terminal 355 is exposed to the extremity of the terminal electrode 352, to form the exposed face 355a. By the above level difference portion, the connector 35 constituting the connector laminated body 350 shown in FIG. 4 can be produced.

Once the connectors 35 have been made by the above procedure, then as shown in FIG. 4B the plurality of connectors 35 are laminated, and pairs of the terminal electrodes 352 of the connectors 35 that have been adjacently arranged, are connected to thereby obtain the connector laminated body 350. The ends on one side of the terminal electrodes 352 of the connectors 35 are formed with the joining materials 356 made from a brazing filler metal and the like. The ends on the other side of the terminal electrodes 352 are the exposed faces 355a with a part of the metal terminals 355 exposed. Therefore, as shown in FIG. 4, if the joining materials 356 and the exposed faces 355a are heated in a state where they are in contact with each other, the connectors 35 that are arranged in lamination can be readily joined and electrically connected.

Packaging of Driving Circuit Unit

Once the connector laminated body 350 has been produced by the above level difference portion, next the driving circuit units 200A to 200D are packaged using the connector laminated body 350.

Firstly, as shown in FIG. 3, in the slot 700 in the reservoir forming substrate 20 is arranged the connector laminated body 350 that has been formed in the above level difference portion. The terminal electrodes 352 exposed to the bottom face side of the connector laminated body 350 (bottom face side of the slot 700), and the upper electrode films 80 of the piezoelectric element extended into the slot 700 are electrically connected. The electrical connection between the terminal electrodes 352 and the upper electrode films 80 is performed using a brazing filler metal such as a leadless solder or an anisotropic conductive material such as ACP or ACF. Specifically, prior to arranging the connector laminated body 350 into the slot 700, on the upper electrode film 80 or the exposed face 355a of the terminal electrode 352 to be connected to the upper electrode film 80 is provided a brazing filler metal or an anisotropic conductive material. Then the connector laminated body 350 is positioned and arranged in the slot 700, after which the upper electrode film 80 and the terminal electrode 352 are electrically connected by heating or applying pressure.

The height of the connector laminated body 350 to be arranged in the slot 700 is preferably the same as or more than the thickness of the reservoir forming substrate 20. If the height of the connector laminated body 350 is less than the thickness of the reservoir forming substrate 20, the terminal electrodes 352 for connecting the driving circuit units 200A to 200D would be arranged lower (passage forming substrate 10 side) than the wiring pattern 34, causing a likelihood of decreasing the reliability of connection when the driving circuit units 200A to 200D are packaged.

The height of the connector laminated body 350 can be readily adjusted by changing the number of lamination of the connectors 35. Alternatively, the height (thickness) of the joining material 356 of the terminal electrode 352, or the height of the metal terminal 355 may be adjusted when the connector 35 is produced.

In the above description, among the terminal electrodes 352 of the connector laminated body 350 shown in FIG. 4B, the case was described where the extremity formed with the exposed face 355a, and the upper electrode film 80 in the slot 700 are electrically connected. However, the direction of the orientation of the connector laminated body 350 may be arranged in reverse. That is, the top face side of the connector laminated body 350 in the drawing of FIG. 4B may be arranged so as to be in contact with the bottom face of the slot 700. In this case, since the extremity of the terminal electrode 352 to be electrically connected to the upper electrode film 80 is already formed with the joining material 356, then if the connector laminated body 350 is arranged in the slot 700 and heated, the terminal electrode 352 and the upper electrode film 80 can be electrically connected by the joining material 356.

Next, the driving circuit units 200A to 200D are flip chip packaged on the wiring pattern 34 formed on the reservoir forming substrate 20, and on the terminal electrode 352 exposed to the top face of the connector laminated body 350. That is, as shown in FIG. 3, the connection terminal 200a formed on one side of the driving circuit units 200A to 200D is arranged facing the reservoir forming substrate 20 side, and is aligned with the wiring pattern 34 and the terminal electrode 352. The connection terminal 200a is then electrically connected by joining to the wiring pattern 34 and the terminal electrode 352 directly or via another conductive material. As a form of this flip chip packaging, Au—Au joining, joining by an anisotropic conductive material using ACP, ACF, or the like, adhesion using a non conductive material using NCP, NCF, or the like may be variously used.

As described above, in the method of manufacturing the droplet ejection head of this embodiment, the circuit connecting unit (upper electrode film 80) of the piezoelectric element 300 extended from the piezoelectric element holding portion 24 to the bottom face of the slot 700 is led out to a position that is substantially in the same plane of the wiring pattern 34 formed on the top face of the reservoir forming substrate 20, by the connector laminated body 350 arranged in the slot 350, and the driving circuit units 200A to 200D are packaged on the wiring pattern 34 and the terminal electrodes 352 exposed to the top face of the connector laminated body 350. Consequently, according to the manufacturing method of this embodiment, the driving circuit units 200A to 200D can be arranged substantially in parallel with the reservoir forming substrate 20, and flip chip packaged thereon. As a result, it is possible to readily and reliably package, and a thin type droplet ejection head can be realized.

Moreover, the manufacturing method of this embodiment can readily cope with the manufacture of a minute droplet ejection head. That is, even in the case where the distance between the piezoelectric elements 300 in relation to the Y axis direction becomes smaller (narrower) due to reducing the nozzle pitch, since the terminal electrodes 352 of the connector 35 can be formed highly accurately using the photolithography technique, it is easy to reduce the diameter of the terminal electrodes 352 and narrow the pitch to match the pitch of the piezoelectric elements 300.

The connector laminated body 350 needs to be prepared separately from the passage forming substrate 10, and the reservoir forming substrate 20 of the droplet ejection head 1. In the production thereof, the terminal electrodes 352 and the wiring are formed using the photolithography technique. However, since a large number of the connectors 35 constituting the connector laminated body 350 can be produced at once using a large silicon substrate, the production cost per one connector is not remarkably increased.

Second Embodiment

Figure 6A:
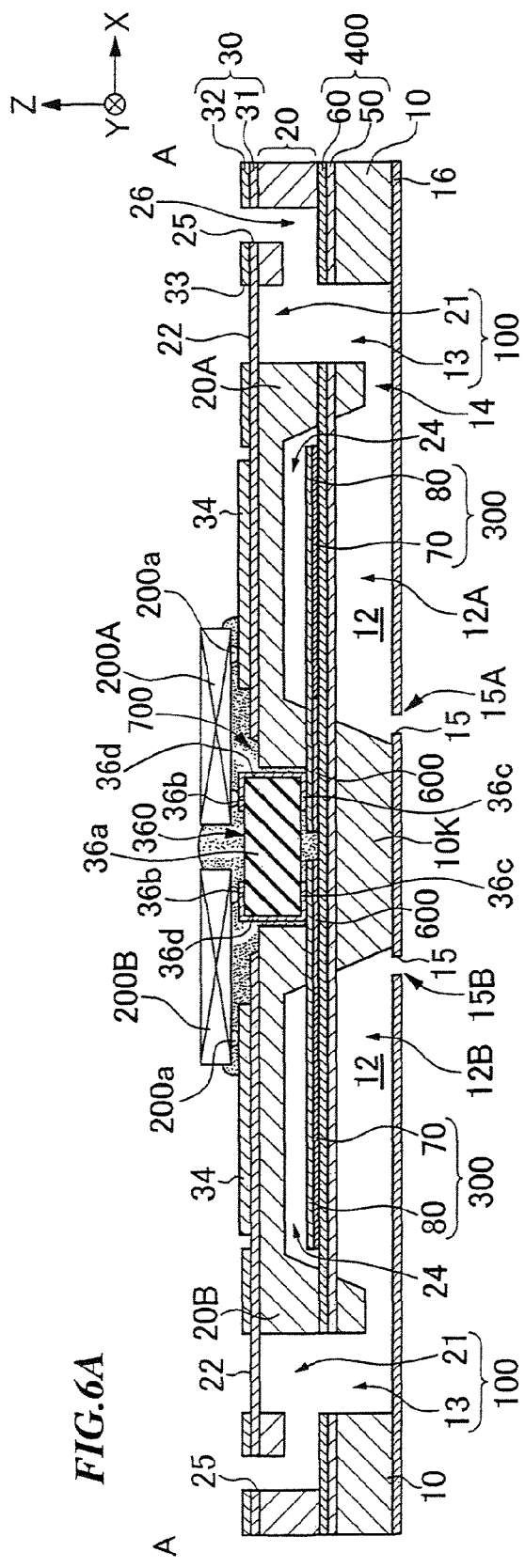
FIG. 6A is a cross-sectional view of a droplet ejection head according to a second embodiment.
Figure 6B:
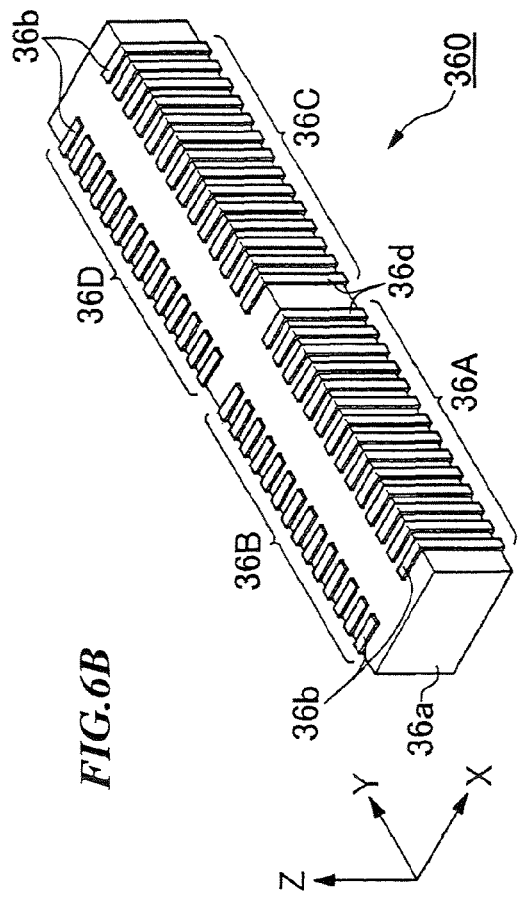
FIG. 6B is a schematic perspective view of a droplet ejection head according to a second embodiment.

Next is a description of a second embodiment of this invention, with reference to FIG. 6. FIG. 6A is a cross-sectional view of the droplet ejection head of this embodiment, corresponding to FIG. 3 in the previous embodiment. FIG. 6B is a perspective view of the connector 360 shown in FIG. 6A.

The droplet ejection head of this embodiment has a characteristic in the configuration of the connector 360 arranged in the slot 700. The other configuration is similar to that of the droplet ejection head of the previous first embodiment. Consequently, hereunder, the configuration of the connector 360 is mainly described. Moreover, in FIG. 6, the same reference symbols as those of FIG. 1 to FIG. 3 are used for components common to the droplet ejection head of the previous embodiment, and detailed description thereof is omitted.

As shown in FIG. 6B, the connector 360 is configured including: a quadratic prism shaped connector base member 36a; a plurality of terminal electrodes (first terminal electrodes) 36b formed in an array on the top face (+Z side face, a first face) of this connector base member 36a in the drawing; a plurality of terminal electrodes (second terminal electrodes) 36c formed in an array on the opposite face (−Z side face, a second face) to the base member face that is formed with these terminal electrodes 36b; and a plurality of connection wirings 36d formed on the side faces (+X side face and −X side face, third faces) of the connector base member 36a for connecting the respective terminal electrodes 36b to the respective corresponding terminal electrodes 36c.

In the connector 360, the terminal electrodes 36b and 36c, and the connection wiring 36d connecting them form one connector terminal, and as shown in FIG. 6A, the connector terminals are arranged on the connector base member 36a at a pitch matching the pitch of the upper electrode films 80 extended into the slot 700.

Of the plurality of connector terminals arranged in the extending direction of the connector 360, the groups of the connector terminals arranged adjacently to each other form a first connector terminal group 36A to a fourth connector terminal group 36D shown in FIG. 6B. The first connector terminal group 36A and the second connector terminal group 36B are arranged opposite to each other in relation to the X axis direction on the top face (and the bottom face) of the connector base member 36a. The third connector terminal group 36C and the fourth connector terminal group 36D are also arranged opposite to each other in relation to the X axis direction on the top face (and the bottom face) of the connector base member 36a.

The connector base member 36a is made from a material, for which at least the surface is nonconductive. For example, there may be used: a compact of a nonconductive material such as a ceramic, glass epoxy, glass, and the like; a base body made from silicon having the surface formed with a silicon oxide film by thermal oxidation; or such a silicon base body having the surface formed with a nonconductive resin film. If the connector base member 36a which is the silicon base body having the surface formed with a nonconductive film is used, the coefficient of thermal expansion can be matched with that of the passage forming substrate 10 and the reservoir forming substrate 20 which are made from a silicon in the same manner. Therefore an advantage of effectively preventing the occurrence of exfoliation and the like in the conductive joining portion, with volume change due to temperature change can be obtained. On the other hand, if a compact of a glass epoxy, or a ceramic or the like is used, superior shock resistance can be obtained compared to the case of using the silicon base body.

The terminal electrodes 36b and 36c, and the connection wiring 36d constituting the connector terminal may be formed from a metal material, a conductive polymer, a superconductor, and the like. The connector terminal is preferably made from a metal material such as Au (gold), Ag (silver), Cu (copper), Al (aluminum), Pd (palladium), and Ni (nickel). In particular, the terminal electrodes 36b and 36c are preferably a pad or a bump formed using Au. This is because, if the connection terminal 200a of the driving circuit units 200A to 200D is an Au bump, reliable joining can be readily obtained by Au—Au joining.

As shown in FIG. 6, the connector 360 including the above configuration is arranged in a state where the terminal electrodes 36c are oriented towards the bottom side of the slot 700, and are flip chip packaged on the upper electrode films 80 of the piezoelectric element 300 extended into the slot 700 via the terminal electrodes 36c. As a form of the flip chip packaging, similarly to the connector laminated body 350 of the previous embodiment, various packaging forms such as packaging by a brazing filler metal, packaging using ACP or ACF, packaging using NCP or NCF, or the like may be employed.

In the detailed description of the packaging condition of the connector 360, of the plurality of the upper electrode films 80 arranged on the bottom face of the slot 700: the first connector terminal group 36A is electrically connected through the terminal electrodes 36c to the upper electrode films 80 of the piezoelectric elements 300 constituting the first piezoelectric element group which correspond to the first nozzle opening group 15A and the first pressure generating chamber group 12A; and the second connector terminal group 36B is electrically connected through the terminal electrodes 36c to the upper electrode films 80 of the piezoelectric elements 300 constituting the second piezoelectric element group which correspond to the second nozzle opening group 15B and the second pressure generating chamber group 12B.

Moreover, although not shown in FIG. 6A, similarly to the first connector terminal group 36A, the third connector terminal group 36C is electrically connected through the terminal electrodes 36c to the upper electrode films 80 of the piezoelectric elements 300 constituting the third piezoelectric element group, and similarly to the second connector terminal group 36B, the fourth connector terminal group 36D is electrically connected through the terminal electrodes 36c to the upper electrode films 80 of the piezoelectric elements 300 constituting the fourth piezoelectric element group.

Since the droplet ejection head of this embodiment including the above configuration is designed to electrically connect the piezoelectric elements 300 (upper electrode film 80) on the bottom face of the slot 700, and the driving circuit units 200A to 200D through a connector 360 of a simple configuration, it can be manufactured at lower cost compared to the droplet ejection head of the previous first embodiment. Moreover, since it has a structure where the slot 700 is embedded with a connector 360 that is a rigid body, the rigidity of the droplet ejection head can be increased and superior reliability can be obtained. In particular, if the silicon base body having the surface formed with a nonconductive film is used as the connector base member 36a, the coefficient of thermal expansion can be matched with that of the passage forming substrate 10 and the reservoir forming substrate 20 which are made from silicon in the same manner. Therefore deterioration in the reliability of the electrical connection due to volume change attributable to temperature change can be effectively prevented.

Method of Manufacturing Connector

If a nonconductive base member such as a ceramic or a glass epoxy is used, the connector 360 used for the droplet ejection head of this embodiment can be produced by pattern-forming the connector terminals (terminal electrodes 36b and 36c and connection wiring 36d) on the surface of the connector base member 36a that has been formed in a predetermined quadratic prism shape. Moreover, if a conductive base body such as a silicon base body is used, the connector 360 can be produced by pattern-forming the connector terminals on the surface of a connector base member that has been obtained by forming a silicon oxide film on the surface of the silicon base body formed in a predetermined quadratic prism shape by thermal oxidation or the like, or on the surface of the connector base member that has been obtained by forming a conductive resin film on the surface of the silicon base body.

Employable examples of a method of pattern-forming the connector terminals on the connector base member 36a include: a method of patterning a conductive film that has been formed using the gas phase method by a photolithography technique; a method of arranging a mask material including openings of a predetermined pattern on the connector base member 36a so as to selectively form the conductive film (metal film) by a gas phase method or a plating method through the mask material; a method of pattern-forming the conductive film using a droplet ejection method; and a method of pattern-forming the conductive film on the connector base member 36a using a printing method.

Hereunder is a description of a method of forming the connector terminals (terminal electrodes 36b and 36c and connection wiring 36d) using the droplet ejection method, as an example of the method of manufacturing the connector 360. In this embodiment, the case of using a quadratic prism shaped ceramic compact as the connector base member 36a is described, however cases of using a connector base member of other materials are similar.

Figure 8:
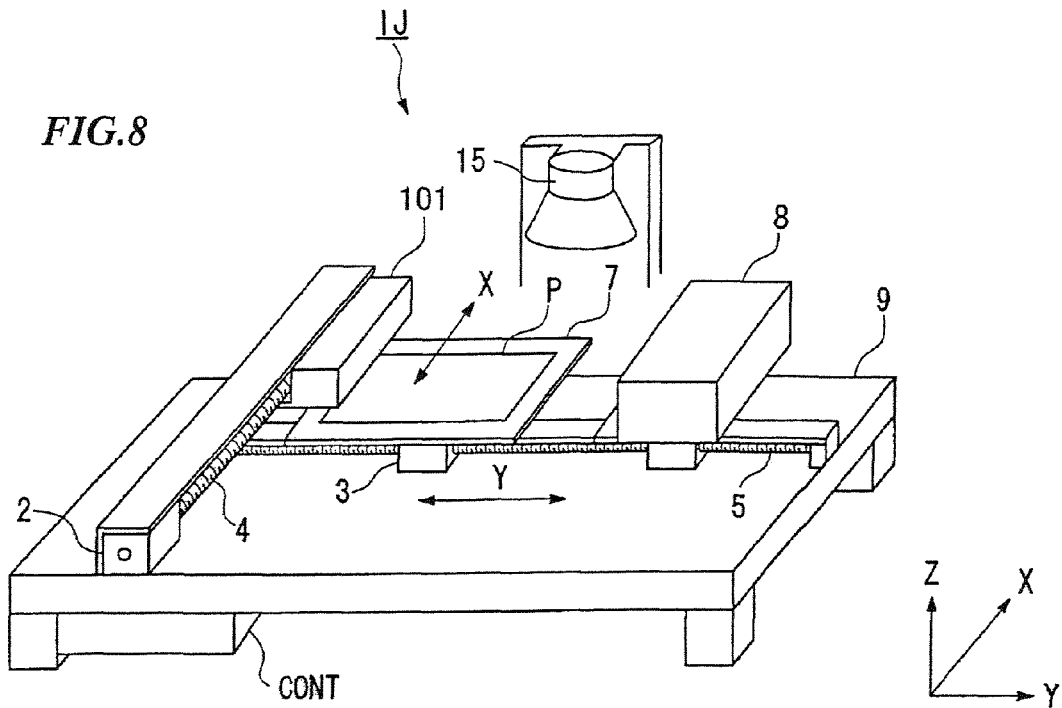
FIG. 8 is a schematic perspective view of an example of a droplet ejection apparatus.

For forming the connector terminals by the droplet ejection method, a droplet ejection apparatus IJ as shown in FIG. 8 may be preferably used. That is, an ink for forming the connector terminals is ejected from a droplet ejection head 101 provided on the droplet ejection apparatus IJ, and arranged so as to form a predetermined pattern on the connector base member 36a. Then, a metal thin film is formed by drying and baking the ink on the connector base member 36a. By sequentially repeating the above level difference portions on the peripheral faces (four faces) of the connector base member 36a, the terminal electrodes 36b and 36c and the connection wiring 36d for connecting them can be formed on the connector base member 36a.

The configuration of the droplet ejection apparatus IJ is described later under the heading of (droplet ejection apparatus).

Ink

If the connector terminal is formed using the droplet ejection apparatus IJ, the ink (functional liquid) to be ejected from the droplet ejection head is a liquid containing conductive particles (pattern forming ingredient). As the liquid containing conductive particles, a dispersing liquid where the conductive particles are dispersed in a dispersion medium is used. For the conductive particles used herein, in addition to metal particles containing Au, Ag, Cu, Pd, Ni, and the like, particles of a superconductor or the like may be used.

In order to improve the dispersibility in the ink, conductive particles having their surface coated with an organic substance or the like may be used. Examples of the coating material to be coated on the surface of the conductive particles include an organic solvent such as xylene and toluene, and citric acid. Moreover, the diameter of the conductive particles is preferably 5 nm or more, but 0.1 μm or less. This is because, if more than 0.1 μm, clogging of the nozzles is likely to occur, making it difficult to eject by the droplet ejection method. If less than 5 nm, the volume ratio of the coating agent with respect to the conductive particles becomes large, causing an excessive proportion of organic substances in the obtained film.

The dispersion medium of the ink containing the conductive particles preferably has a vapor pressure at room temperature of 0.001 mmHg or more but 200 mmHg or less (about 0.133 Pa or more but 26600 Pa or less). This is because, if the vapor pressure were more than 200 mmHg, the dispersion medium is rapidly evaporated after ejecting, making it difficult to form an excellent film.

Moreover, the vapor pressure of the dispersion medium is preferably 0.001 mmHg or more but 50 mmHg or less (about 0.133 Pa or more but 6650 Pa or less). This is because, if the vapor pressure were more than 50 mmHg, clogging of the nozzles is likely to occur due to drying when the droplets are being ejected by the droplet ejection method, making it difficult to stably eject. On the other hand, in the case of a dispersion medium having a vapor pressure at room temperature of less than 0.001 mmHg, the drying becomes slower and the dispersion medium is likely to remain in the film, making it difficult to obtain a conductive film of good quality after heat and/or photo treatment in the later level difference portions.

The dispersion medium to be used is not specifically limited as long as the conductive particles can be dispersed, and are not aggregated therein. Examples in addition to water include: alcohols such as methanol, ethanol, propanol, and butanol; hydrocarbon compounds such as n-heptane, n-octane, decane, toluene, xylene, cymene, dulene, indene, dipentene, tetrahydronaphthalene, decahydronaphthalene, cyclohexylbenzene, and the like; ether compounds such as ethyleneglycol dimethyl ether, ethyleneglycol diethyl ether, ethyleneglycol methylethyl ether, diethyleneglycol dimethyl ether, diethyleneglycol diethyl ether, diethyleneglycol methylethyl ether, 1, 2-dimethoxyethane, bis(2-methoxyethyl) ether, and p-dioxane; and polar compounds such as propylene carbonate, γ-butyrolactone, N-methyl-2-pyrrolidone, dimethylformamide, dimethylsulfoxide, and cyclohexanone.

Among the dispersion mediums mentioned above, preferred examples include water, alcohols, hydrocarbon compounds, and ether compounds, in terms of dispersibility of particles, the stability of the dispersing liquid, and the easiness of application to the droplet ejection method. More preferred dispersion mediums include water and hydrocarbon compounds. These dispersion mediums may be used solely or in mixture of two or more types. The dispersoid concentration in the case of dispersing the conductive particles in the dispersion medium is 1% by mass or more but 80% by mass or less, which can be adjusted according to the thickness of the desired conductive film. If it exceeds 80% by mass, aggregation is likely to occur and an even film is difficult to obtain.

The surface tension of the ink including the conductive particles is preferably within a range of 0.02 N/m or more but 0.07 N/m or less. This is because when the ink is ejected by the droplet ejection method, if the surface tension is less than 0.02 N/m, the wettability of the ink with respect to the nozzle surface is increased, so that flight deflection is likely to occur. If it exceeds 0.07 N/m, the shape of meniscus at the tip of the nozzle becomes unstable, making it difficult to control an amount of the droplet of the ejection, and ejection timing.

In order to adjust the surface tension, the dispersing liquid may be added with a trace amount of surface tension modifier such as a fluorine group, a silicon group, a nonionic group or the like, within a range so as to not excessively decrease the contact angle with the substrate. The nonionic surface tension modifier improves the wettability of liquid to the substrate, improves the leveling property of the film, and is useful for preventing the occurrence of spotty coating film, the occurrence of orange peeling, and the like. The dispersing liquid may include organic compounds such as alcohol, ether, ester, ketone, and the like, as necessary.

The viscosity of the dispersing liquid is preferably 1 mPa·s or more but 50 mPa·s or less. This is because if the viscosity is less than 1 mPa·s when ejecting by the droplet ejection method, the periphery of the nozzle is easily contaminated due to the outflow of ink. If the viscosity is more than 50 mPa·s, the clogging at the nozzle occurs more frequently, making it difficult to smoothly eject the droplets. In the case where the connector terminals shown in FIG. 6B are formed from a metal film, then for example, a gold particle dispersing liquid (ULVAC Materials, Inc., product name "perfect gold") with gold particles having a diameter of about 10 nm dispersed in toluene, is diluted with toluene, so as to adjust the viscosity to about 5 mPa·s and the surface tension to about 20 mN/m, and this liquid is used as an ink for forming the terminal electrodes 36b and 36c and the connection wiring 36d.

Procedure for Forming Connector Terminals

Once the above ink has been prepared, a step for ejecting droplets of the ink from the droplet ejection head 101 shown in FIG. 8, and arranging them on the connector base member 36a, is performed.

Here, prior to the droplet ejecting level difference portion, a surface treatment may be performed on the connector base member 36a. That is, regarding the surface of the connector base member 36a to be coated with the ink, prior to the ink coating, an ink repellent treatment (liquid repellent treatment) may be applied. By applying such an ink repellent treatment, the position of the ink to be ejected and arranged (coated) onto the connector base member 36a can be highly accurately controlled.

In order to perform the ink repellent treatment on the surface of the connector base member 36a, firstly the prepared connector base member 36a is washed with IPA (isopropyl alcohol) or the like. Then, it may be further washed (ultraviolet ray irradiation washing) by irradiating ultraviolet rays having a wavelength of 254 nm with an intensity of about 10 mW/cm$^2$. After the washing is completed, in order to apply the ink repellent treatment onto the surface of the connector base member 36a, the connector base member 36a is put into an airtight container with for example, 0.1 g of hexadecafluoro 1,1,2,2 tetrahydrodecyltriethoxysilane, and held in a heated state (about 120° C.). As a result, an ink repellent monomolecular film can be formed on the surface of the connector base member 36a. The surface of the connector base member 36a formed with the monomolecular film has a contact angle with the ink of for example, about 60 degrees.

If the ink repellency of the connector base member 36a is too high, the connector base member 36a formed with the monomolecular film may be further irradiated with ultraviolet rays (wavelength of 254 nm) for example, for 2 minutes. By this treatment, the ink repellency of the connector base member 36a can be decreased.

Moreover, instead of the above ink repellent treatment, a receptive layer may be formed on the connector base member 36a. That is, for example, a porous material or a hydrophilic polymer having binder and porous silica particles, alumina, hydrated alumina, and the like that is capable of swelling and absorbing the ink, may be formed as a receptive layer.

After the ink repellent treatment is applied onto the surface of the connector base member 36a as necessary, droplets of the ink are ejected from the droplet ejection head 101, and dropped in a predetermined position on the connector base member 36a. In this level difference portion, by ejecting droplets onto the connector base member 36a while scanning the droplet ejection head 101, a plurality of ink patterns (for example, ink pattern to become the terminal electrodes 36b) are formed on one side of the connector base member 36a.

At this time, in the case where the droplets are continually ejected to perform the pattern-forming, the degree of overlapping of the droplets is preferably controlled so as to not generate liquid pools (bulges). In this case, bulges can be satisfactorily prevented if there is employed a ejecting and arranging method such that, when ejecting at the first time, a plurality of droplets are ejected and arranged separated so that they do not make contact with each other, and then the spaces therebetween are filled by ejecting at the second time and thereafter.

After the droplets are ejected and the predetermined ink pattern is formed on the connector base member 36a, in order to remove the dispersion medium from the ink, a drying treatment is performed as necessary. The drying treatment may be also performed by lamp annealing, in addition to for example, treatment by a normal hot plate or an electric furnace, or the like that heats the substrate. Although the light source of the light used for lamp annealing is not specifically limited, an infrared ray lamp, a xenon lamp, a YAG laser, an argon laser, a carbon dioxide gas laser, an excimer laser of for example XeF, XeCl, XeBr, KrF, KrCl, ArF, ArCl, and the like may be used as the light source. For these light sources, generally ones within an output range of 10 W or more but 5000 W or less are used. However, in this embodiment, a range of 100 W or more but 1000 W or less is sufficient.

Next, with respect to the dried film that has been obtained by drying the ink pattern, a baking treatment for improving the electrical contact between particles is performed. By this baking treatment, the dispersion medium is completely removed from the dried film, and moreover if an organic coating or the like for improving the dispersibility is applied onto the surface of the conductive particles, the coating is also removed.

The baking treatment is performed by heat treatment, light treatment, or a combination thereof. The baking treatment is normally performed in the air, however it may be performed in an inert gas atmosphere of nitrogen, argon, helium, or the like as necessary. The temperature of the baking treatment is appropriately determined by considering the boiling point (vapor pressure) of the dispersion medium, the type and the pressure of the atmospheric gas, the thermal behavior such as the dispersibility and the oxidizability of the particles, the presence/absence and the amount of the coating material, the heat-resistive temperature of the base member, and the like. For example, in order to remove the coating material made from an organic substance, it is necessary to bake at about 300° C. Moreover, in the case of using a substrate of a plastics or the like, baking is preferably performed at room temperature or more but 100° C. or less.

The baking treatment may also be performed by lamp annealing, in addition to treatments by a normal hot plate, an electric furnace, and the like. Although the light source of the light used for lamp annealing is not specifically limited, an infrared ray lamp, a xenon lamp, a YAG laser, an argon laser, a carbon dioxide gas laser, an excimer laser of for example XeF, XeCl, XeBr, KrF, KrCl, ArF, ArCl, and the like may be used as a the light source. For these light sources generally ones within an output range of 10 W or more but 5000 W or less are used. However, in this embodiment, a range of 100 W or more but 1000 W or less is sufficient. By the above level difference portion, electrical contact between the particles in the film is ensured and the film is converted into a conductive film.

Then, by performing the above droplet ejecting level difference portion, drying level difference portion, and baking level difference portion onto the respective sides of the connector base member 36a, the connector 360 formed with a plurality of connector terminals on the connector base member 36a can be manufactured.

Alternatively, the conversion from the dried film into the conductive film may be performed by performing the droplet ejecting level difference portion and the drying level difference portion on the respective sides of the connector base member 36a, to thereby form dried films of the predetermined pattern on the respective sides of the connector base member 36a, and then performing the baking step for the whole. Since the dried film has many gaps between the conductive particles constituting it, if the ink is arranged thereon, the ink can be held satisfactorily. Consequently, in a state with the dried film formed on one side of the connector base member 36a, the droplet ejecting level difference portion is performed on the other side, and by so doing, the connectability of the dried films formed on the respective sides can be improved. That is, the connectability in the joining part between the terminal electrodes 36b and the connection wiring 36d, and the joining part between the terminal electrodes 36c and the connection wiring 36d can be improved, and connector terminals having more superior reliability can be formed.

Third Embodiment

Next is a description of a third embodiment of this invention with reference to FIG. 7. FIG. 7A is a cross-sectional view of the droplet ejection head of this embodiment, corresponding to FIG. 3 in the previous embodiment. FIG. 7B is a plan view of the flexible substrate 501 shown in FIG. 7A.

The droplet ejection head of this embodiment has a characteristic in the configuration where the driving circuit units 200A to 200D are packaged via the first flexible substrate 501, the second flexible substrate 502, and the third and fourth flexible substrates (not shown) on the connector 360 shown in FIG. 6B. Consequently, in the droplet ejection head of this embodiment, the configuration other than the package structure of the driving circuit units 200A to 200D is similar to that of the droplet ejection head of the second embodiment shown in FIG. 6. Therefore, in FIG. 7, the same reference symbols are used for components common to FIG. 6, and detailed description thereof is omitted.

As shown in FIG. 7A, the droplet ejection head of this embodiment includes a configuration in which the connector 360 is arranged in a slot 700 that has been provided by opening a hole in the reservoir forming substrate 20, and the first flexible substrate 501 and the second flexible substrate 502 are packaged on terminal electrodes 36b on the top face (+Z side face) of this connector 360 in the drawing. The driving circuit units 200A to 200D are respectively flip chip packaged on the bottom face (−Z side face) of the flexible substrates 501 and 502 in the drawing. Between the driving circuit unit 200A and the flexible substrate 501 is sealed by a resin mold 202, and between the driving circuit unit 200B and the flexible substrate 502 is sealed by a resin mold 202. As a form of the flip chip packaging of the driving circuit units 200A to 200D, similarly to the previous embodiment, various packaging forms such as packaging by a brazing filler metal, packaging using ACP or ACF, packaging using NCP or NCF, or the like may be employed.

FIG. 7B is a plan view of the flexible substrate 501 viewed from the bottom face side (−Z side) of FIG. 7A. The driving circuit unit 200A is packaged on the first flexible substrate 501 of a substantial convex shape in cross-sectional view. A plurality of wiring patterns 510 are extended from the packaged position of the driving circuit unit 200A in the −X direction in the drawing. The respective wiring patterns 510 are electrically connected to a connection terminal group 507 including a plurality of connection terminals that are arranged on the −X side end of the flexible substrate 501. Moreover, a plurality of wiring patterns 511 are extended from the packaged position of the driving circuit unit 200A in the +X direction, and the respective wiring patterns 511 are electrically connected to a connection terminal group 508 including a plurality of connection terminals that are arranged on the +X side end of the flexible substrate 501. The first flexible substrate 501 is electrically connected to the terminal electrodes 36b (first connector terminal group 36A) of the connector 360 by the connection terminal group 507 on the −X side end, and connected to the external circuit (not shown) by the connection terminal group 508 on the +X side end.

Moreover, although omitted from the figure, the second flexible substrate 502 having the driving circuit unit 200B packaged thereon includes a similar configuration to that of the first flexible substrate 501. Furthermore, the third flexible substrate and the fourth flexible substrate having the driving circuit units 200C and 200D respectively packaged thereon includes a similar configuration to that of the first flexible substrate 501.

The first flexible substrate 501 shown in FIG. 7B and the second to fourth flexible substrates including a similar configuration thereof, are electrically connected to the terminal electrodes 36b on the top face of the connector 360 arranged in the slot 700 formed in the center of the reservoir forming substrate 20 in the drawing, constituting the droplet ejection head of this embodiment. The electrical connection between the first to fourth flexible substrates and the terminal electrodes 36b can be performed by joining using various joining materials such as a brazing filler metal, ACP, ACF, NCP, NCF, or the like.

In the droplet ejection head of this embodiment, the thickness (height) of the connector 360 to be arranged in the slot 700 is preferably more than the thickness of the reservoir forming substrate 20. This is so that the respective flexible substrates can be readily connected.

According to the droplet ejection head of this embodiment including the above configuration, since the first to fourth flexible substrates having the driving circuit units 200A to 200D packaged thereon, are electrically connected to the circuit connecting units of the piezoelectric elements 300 that have been led out to the top face side of the reservoir forming substrate 20 by the connector 360, then when this droplet ejection head is attached to a droplet ejection apparatus such as a printer unit, the manageability of the connection terminal part can be improved by the flexibility of the flexible substrate. Moreover, since the degree of freedom of the packaging form of the driving circuit units 200A to 200D is increased, modification of the lead out form of the wiring according to changes in the driving circuit units is facilitated.

In this embodiment, the configuration in which the separate flexible substrates are connected to the respective connector terminal groups 36A to 36 of the connector 360 is illustrated and described. However the configuration may be such that the four driving circuit units 200A to 200D are packaged on one flexible substrate, and such a flexible substrate is electrically connected to the connector 360. Moreover, the configuration may be also such that, a flexible substrate which is the integrated body of the first flexible substrate and the third flexible substrate arranged on the same side in the X axis direction with respect to the slot 700, is connected to the connector terminal on the +X side of the connector 360, and a flexible substrate which is the integrated body of the second flexible substrate and the fourth flexible substrate is connected to the connector terminal on the −X side.

Moreover, there may be employed a configuration in which, between the reservoir forming substrate 20 and the driving circuit units 200A to 200D packaged on the bottom face side of the first to fourth flexible substrates is sealed by a resin mold or the like. If the driving circuit units 200A to 200D are sealed and fixed to the reservoir forming substrate 20 in this manner, the overall droplet ejection head including the driving circuit units 200A to 200D can be integrally formed, and a droplet ejection head having a superior handling properties can be obtained. Moreover, since the driving circuit units 200A to 200D are sealed between the flexible substrate and the reservoir forming substrate, the driving circuit units 200A to 200D can be satisfactorily protected, and the reliability of the droplet ejection head can be increased.

Droplet Ejection Apparatus

Next is a description of an example of a droplet ejection apparatus including the droplet ejection head of the previous embodiment, with reference to FIG. 7. FIG. 8 is a perspective view showing a schematic diagram of the droplet ejection apparatus IJ including the droplet ejection head of the aforementioned respective embodiments.

The droplet ejection apparatus IJ includes; a droplet ejection head 101 according to this invention, an X axis direction drive shaft 4, a Y axis direction guide shaft 5, a controller CONT, a stage 7, a cleaning mechanism 8, a base 9, and a heater 15. The stage 7 is to support a substrate P on which the ink (liquid material) is provided by this droplet ejection apparatus IJ, and includes a fixation mechanism (not shown) which fixes the substrate P in a reference position.

As described above, the droplet ejection head 101 is a multi nozzle type droplet ejection head including a plurality of ejection nozzles, having the longitudinal direction matched with the Y axis direction. A plurality of ejection nozzles are provided side by side at fixed intervals in alignment along the Y axis direction on the bottom face of the droplet ejection head 101. An ink (for example, ink containing conductive particles) according to the type of the functional film to be formed, is ejected from the nozzles of the ejection head 101 onto the substrate P supported by the stage 7.

An X axis direction drive motor 2 is connected to the X axis direction drive shaft 4. The X axis direction drive motor 2 is a level difference portioning motor or the like, which rotates the X axis direction drive shaft 4 when drive signals for the X axis direction are supplied from the controller CONT. When the X axis direction drive shaft 304 is rotated, the droplet ejection head 101 is moved in the X axis direction.

The Y axis direction guide shaft 5 is stationarily fixed to the base 9. The stage 7 includes a Y axis direction drive motor 3. The Y axis direction drive motor 3 is a level difference portioning motor or the like, which moves the stage 7 in the Y axis direction when drive signals for the Y axis direction are supplied from the controller CONT.

The controller CONT supplies the droplet ejection head 101 with a voltage for controlling the ejection of droplets. Moreover, it supplies the X axis direction drive motor 2 with drive pulse signals to control the movement of the droplet ejection head 101 in the X axis direction, and supplies the Y axis direction drive motor 3 with drive pulse signals to control the movement of the stage 7 in the Y axis direction.

The cleaning mechanism 8 is for cleaning the droplet ejection head 101. The cleaning mechanism 8 includes a Y axis direction drive motor (not shown). By drive of the Y axis direction drive motor, the cleaning mechanism is moved along the Y axis direction guide shaft 5. The movement of the cleaning mechanism 8 is also controlled by the controller CONT.

The heater 15 is a device which performs heat treatment on the substrate P by lamp annealing, and evaporates and dries the solvent contained in the liquid material that has been coated on the substrate P. The turning-on and turning-off of the power supply for this heater 15 is also controlled by the controller CONT.

The droplet ejection apparatus IJ ejects droplets onto the substrate P while relatively scanning the droplet ejection head 101 and the stage 7 which supports the substrate P. In the description hereunder, it is assumed that the X axis direction is the scanning direction, and the Y axis direction orthogonal to the X axis direction is the non scanning direction. Consequently, the ejection nozzles of the droplet ejection head 101 are provided side by side at fixed intervals in the Y axis direction, being the non scanning direction.

In FIG. 8, the droplet ejection head 101 is arranged at right angles with respect to the traveling direction of the substrate P. However the angle of the droplet ejection head 101 may be adjusted so that the arrangement is such that the nozzles are arrayed in a direction intersecting the traveling direction of the substrate P. In this manner, by adjusting the angle of the droplet ejection head 101, the pitch between the nozzles can be adjusted. Alternatively, the arrangement may be such that the distance between the substrate P and the nozzle surface can be optionally adjusted.

The droplet ejection apparatus IJ including the above configuration may be suitably used as a device forming apparatus for forming various kinds of devices by the liquid phase method. In this configuration, as the ink (functional liquid) to be ejected from the droplet ejection head, there may be used inks containing a liquid crystal display device forming material for forming a liquid crystal display device, an organic EL display forming material for forming an organic EL display device, a wiring pattern forming material for forming a wiring pattern of an electronic circuit, and the like. According to the manufacturing process of selecting and arranging these functional liquids onto the base body by the droplet ejection apparatus, since pattern-arrangement of the functional materials is possible without going through the photolithography level difference portion, a liquid crystal display device, an organic EL display device, a circuit board, and the like can be manufactured at low cost.

Moreover, the droplet ejection apparatus according to this invention may be configured as a printer (inkjet printer) which includes the droplet ejection head as an image forming device, or may configured as a printer unit which can be realized by incorporating the droplet ejection head. Such a printer unit can be installed for example in a display device such as a television, or an input device such as a white board, and used for printing the image that has been displayed or inputted by the display device or the input device.

Semiconductor Device

In the above embodiments, the droplet ejection head including the device package structure according to this invention, and the manufacturing method therefor are described. The technical scope of this invention is not limited to the above embodiments, and is applicable to for example, a package structure of a semiconductor device having a structure where a plurality of IC chips are three-dimensionally laminated.

Figure 9:
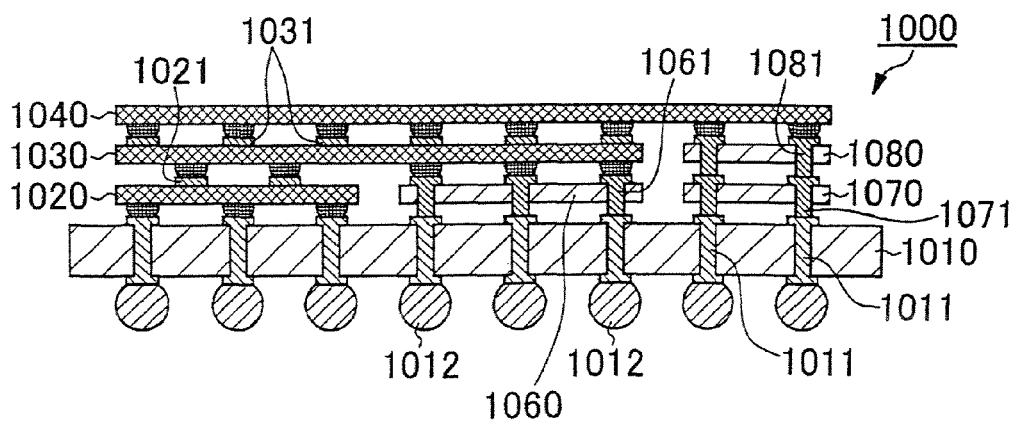
FIG. 9 is a cross-sectional view of an example of a semiconductor device.

FIG. 9 is a cross-sectional view of an example of a semiconductor device using SIP (System In Package) technology. The semiconductor device 1000 shown in FIG. 9 includes a base substrate (base body) 1010, a plurality of IC chips (devices) 1020, 1030, and 1040 laminated on the base substrate 1010, and a plurality of connectors 1060, 1070, and 1080 constituting the conductive connection structure between these IC chips and the base substrate 1010.

The base substrate 1010 is mainly made from for example, a silicon substrate, provided with a plurality of (8 in the drawing) through electrodes (conductive connection portions) 1011 piercing through the base substrate 1010 in the board thickness direction. The respective through electrodes 1011 exposed on the bottom face side of the base substrate 1010 in the drawing are provided with substantially globular bumps 1012 serving as connection terminals when the semiconductor device 1000 is packaged in electronic equipment and the like.

On the through electrodes 1011 exposed on the top face side of the base substrate 1010 in the drawing are packaged an IC chip 1020, a connector 1060, and a connector 1070 sequentially from the left in the drawing. The IC chip 1020 is a double face packaging type IC chip including the connection terminals also on the top face side in the drawing. Moreover, the connectors 1060, 1070, and 1080 are made from silicon substrates and the like as the base member, and have through electrodes (terminal electrodes) 1061, 1071, and 1081 which pierce through these base members. These connectors 1060, 1070, and 1080 may be applied with a similar configuration to that of the connector 35 according to the first embodiment, and may be produced using a similar method to that of the connector 35.

On the pad 1021 provided on the top face of the IC chip 1020 is packaged the IC chip 1030 having a greater width than that of the IC chip 1020. The IC chip 1030 is packaged onto the through electrode 1071 of the connector 1070 in a region outside of the IC chip 1020. Moreover, in the same layer to that of the IC chip 1030, the connector 1080 is laminated and arranged on the connector 1070, and the through electrode 1071 of the connector 1070 and the through electrode 1081 of the connector 1080 are electrically connected. The IC chip 1040 having a greater width that that of the IC chip 1030 is packaged onto a plurality of pads 1031 provided on the top face of the IC chip 1030, and the through electrode 1081 of the connector 1080.

That is, in the semiconductor device 1000 of this embodiment, by laminating and arranging the IC chip 1030 which is larger than the IC chip 1020 on the IC chip 1020, the level difference portion occurring between the base substrate 1010 and the IC chip 1030 is eliminated by the connector 1060 having a height corresponding to this level difference portion, and the IC chip 1030 and the through electrodes 1011 of the base substrate 1010 are electrically connected. Moreover, by laminating and arranging the IC chip 1040 which is larger than the IC chip 1030 on the IC chip 1030, the level difference portion occurring between the base substrate 1010 and the IC chip 1040 is eliminated by the connector laminated body having a height corresponding to this level difference portion, made by laminating the connector 1070 and the connector 1080, and the connection terminals of the IC chip 1040 and the through electrodes 1011 of the base substrate 1010 are electrically connected.

In this manner, in the semiconductor device 1000 of this embodiment, by employing a configuration in which the smaller IC chips are arranged on the base substrate 1010 side and the larger IC chips are laminated and packaged thereon, the signal lines of the IC chips 1030 and 1040 on the upper layer side can be directly led out to the connection terminals of the base substrate 1010 by the connectors 1060, 1070 and 1080. As a result, it becomes unnecessary to provide an electrode for relaying the signal lines of the IC chips on the upper layer side to the IC chips arranged on the lower layer side. Therefore general purpose IC chips can be packaged on the base substrate 1010, and a highly functional semiconductor device can be obtained at low cost.

The configuration shown in FIG. 9 only illustrates one configuration example of the semiconductor device according to this invention, and the technical scope of this invention is not limited to such an embodiment.

Fourth Embodiment

Droplet Ejection Head

Figure 10:
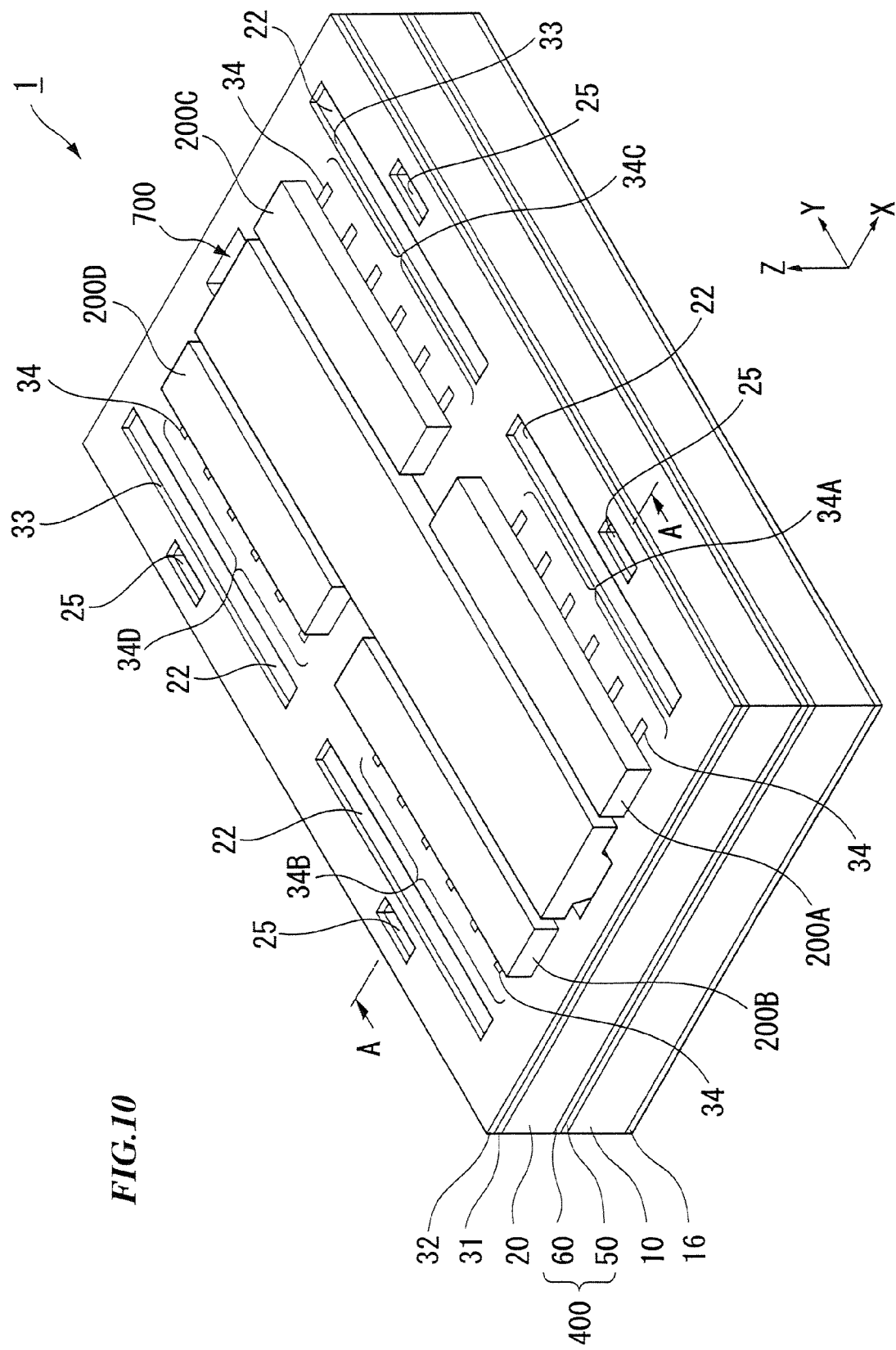
FIG. 10 is a schematic perspective view of a droplet ejection head according to a fourth embodiment.
Figure 11:
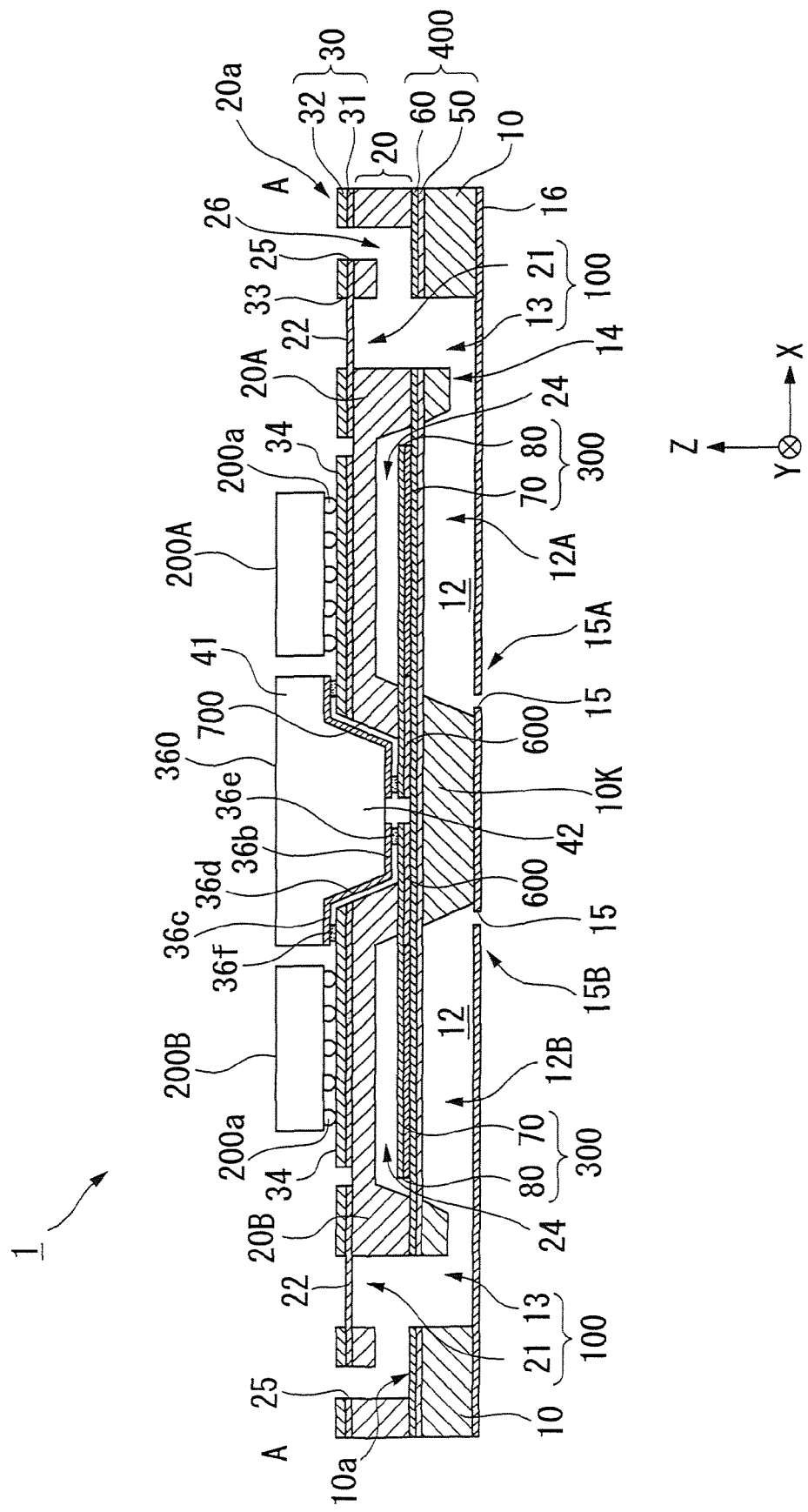
FIG. 11 is a cross-sectional view of the droplet ejection head taken along the line A-A shown in FIG. 10.

Subsequently, as a fourth embodiment of this invention, a droplet ejection head wherein this invention includes a device package structure, is described with reference to FIG. 10 and FIG. 11. FIG. 10 is a perspective view of one embodiment of the droplet ejection head. FIG. 11 is a cross-sectional view taken along the line A-A in FIG. 10.

In these drawings, the same reference symbols are used for components the same as in the first to third embodiments shown in FIG. 1 to FIG. 9, and detailed description thereof is omitted or simplified.

A droplet ejection head 1 of this embodiment is for ejecting an ink (functional liquid) in droplet form from a nozzle. As shown in FIG. 10 and FIG. 11, the droplet ejection head 1 is configured including: a nozzle substrate 16 which includes nozzle openings 15 through which droplets are ejected; a passage forming substrate 10 which is connected to the top face (+Z side) of the nozzle substrate 16 to form ink passages; a vibration plate 400 which is connected to the top face of the passage forming substrate 10 and is displaced by drive of piezoelectric elements (drive elements) 300; a reservoir forming substrate (protective substrate) 20 which is connected to the top face of the vibration plate 400 to form reservoirs 100; four driving circuit units (driver ICs, devices) 200A to 200D for driving the piezoelectric elements 300, provided on the reservoir forming substrate 20; and a plurality of wiring patterns (second conductive connection portions) 34 which are connected to the driving circuit units 200A to 200D. The base body according to this invention is constituted by the passage forming substrate 10 and the reservoir forming substrate 20.

As shown in FIG. 11, the piezoelectric element 300 for deforming the vibration plate 400 includes a structure having a piezoelectric film 70 and an upper electrode film (first conductive connection portion) 80 sequentially laminated from the lower electrode film 60 side, formed on the top face (+Z side face; first face) 10a of the passage forming substrate 10. The thickness of the piezoelectric film 70 is for example about 1 μm. The thickness of the upper electrode film 80 is for example about 0.1 μm.

As a concept of the piezoelectric element 300, in addition to the piezoelectric film 70 and the upper electrode film 80, it may include the lower electrode film 60. This is because the lower electrode film 60 functions as the piezoelectric element 300 and also functions as the vibration plate 400. In this embodiment, there is employed a configuration in which the elastic film 50 and the lower electrode film 60 function as the vibration plate 400. However the configuration may be such that the elastic film 50 is omitted, and the lower electrode film 60 has both functions of itself and as an elastic film (50).

As shown in FIG. 10, on the reservoir forming substrate 20 is arranged the four driving circuit units 200A to 200D. The driving circuit units 200A to 200D are configured by including, for example a semiconductor integrated circuit (IC) including a circuit board or a driving circuit. Each driving circuit unit 200A to 200D includes a plurality of connection terminals 200a on the bottom face side in the drawing. The connection terminals 200a are connected to the wiring patterns 34 formed on the top face (second face) 20a of the reservoir forming substrate 20.

As shown in FIG. 10 and FIG. 11, in the center in relation to the X axis direction of the reservoir forming substrate 20 is formed a slot (through hole) 700 extending in the Y axis direction, which has a tapered shape such that the diameter is decreased as the cross-section goes downward. That is, in the droplet ejection head of this embodiment, this slot 700 forms a level difference portion which separates the upper electrode films 80 (circuit connecting unit) of the piezoelectric elements 300, and the connection terminals 200a (wiring pattern 34) of the driving circuit units 200A to 200D that are to be connected thereto.

Moreover, in the slot 700, a connector 360 is arranged and positioned on the upper electrode films 80 of the respective piezoelectric elements 300 that have been exposed to the bottom face of the slot 700. In the droplet ejection head 1 of this embodiment, by means of this connector 360, the level difference portion between the bottom face (top face 10a of the passage forming substrate 10) of the slot 700 and the top face 20a of the reservoir forming substrate 20 on which the driving circuit units 200A to 200D are arranged is eliminated, and the driving circuit units 200A to 200D are packaged on the reservoir forming substrate 20 in a planar manner.

Figure 12:
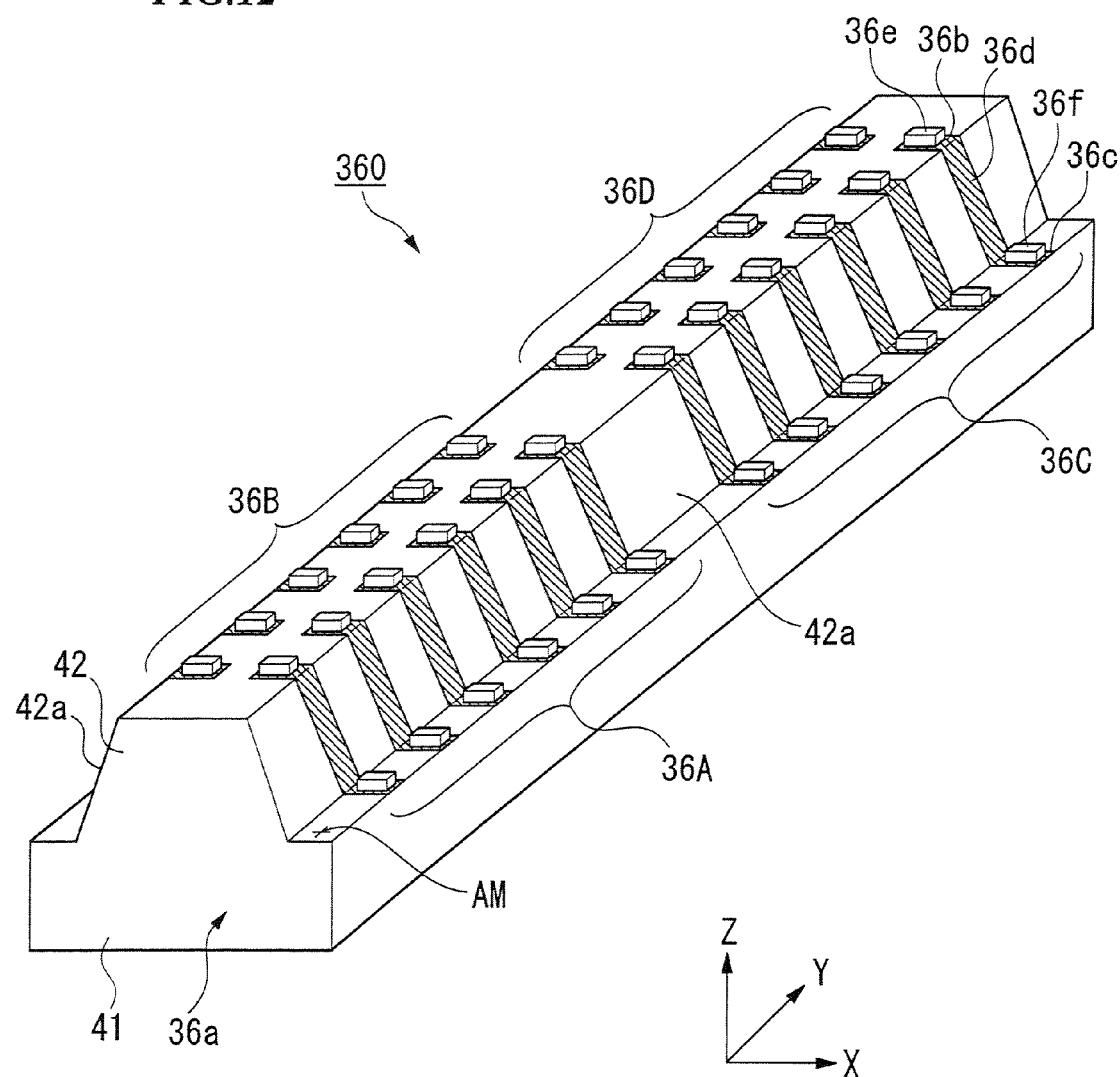
FIG. 12 is a perspective view of a connector.

As shown in FIG. 12, the connector 360 is configured including: a quadratic prism shaped connector base member 36a which includes end portion 41, and a projecting portion 42 having inclined-faces 42a which become narrower upward, and which is provided to project in the central portion in the widthwise direction of the end portion 41 along the lengthwise direction (Y axis direction); a plurality of terminal electrodes (first terminal electrodes) 36b formed in an array on the top face (+Z side face) of the projecting portion 42 in the drawing; a plurality of terminal electrodes (second terminal electrodes) 36c formed in an array on the top face (+Z side face) of the end portion 41 in the drawing; a plurality of connection wirings 36d formed on the inclined-faces 42a (+X side face and −X side face) of the projecting portion 42 for connecting the respective terminal electrodes 36b to the respective corresponding terminal electrodes 36c; and bumps 36e and 36f which are respectively projectingly provided on the terminal electrodes 36b and 36c.

As shown in FIG. 11, the projecting portion 42 is formed to have a width such that it does not contact with the slot 700 of the reservoir forming substrate 20. Moreover, the projecting portion 42 is formed to have substantially the same height (length in the Z direction) as the height of the level difference portion between the wiring patterns 34 and the upper electrode films 80 (that is, the height between the top face 10a of the passage forming substrate 10 and the top face 20a of the reservoir forming substrate 20).

In the connector 360, the terminal electrodes 36b and 36c, the connection wiring 36d connecting them, and the bumps 36e and 36f form one connector terminal, and as shown in FIG. 11, the connector terminals are arranged on the connector base member 36a at a pitch matching the pitch of the upper electrode films 80 extended into the slot 700.

Of the plurality of connector terminals arranged in the extending direction of the connector 360, the groups of the connector terminals arranged adjacently to each other form a first connector terminal group 36A to a fourth connector terminal group 36D shown in FIG. 12. The first connector terminal group 36A and the second connector terminal group 36B are arranged opposite to each other in relation to the X axis direction on the top face of the connector base member 36a. The third connector terminal group 36C and the fourth connector terminal group 36D are also arranged opposite to each other in relation to the X axis direction on the top face of the connector base member 36a.

Moreover, the connector 360 is formed with alignment marks AM positioned on a part of the face on which the terminal electrodes 36c is formed. The alignment mark AM is a reference for detecting the position of the first connector terminal group 36A to the fourth connector terminal group 36D. The alignment marks are formed at the position in the vicinity of the end on the −Y side on the same plane of that of the terminal electrodes 36c and the bumps 36f and on the +X side, and at the position in the vicinity of the end on the +Y side and on the plane on the −X side (the alignment mark on this side is not shown), to accurately align the relative positions with respect to the first connector terminal group 36A, the second connector terminal group 36B, the third connector terminal group 36C, and the fourth connector terminal group 36D. By forming these alignment marks AM from the same material and by the same process as that of the terminal electrodes 36c and the bumps 36f, the accuracy of the relative positions with respect to the first connector terminal group 36A to fourth connector terminal group 36D can be readily maintained.

The connector base member 36a is made from a material, for which at least the surface is nonconductive. For example there may be used: a compact of a nonconductive material such as a ceramic, glass epoxy, glass, and the like; a base body made from silicon (Si) having the surface formed with a silicon oxide film by thermal oxidation; or such a silicon base body having the surface formed with a nonconductive resin film. If the connector base member 36a which is the silicon base body having the surface formed with a nonconductive film is used, the coefficient of linear expansion becomes substantially the same as that of the passage forming substrate 10 and the reservoir forming substrate 20 which are made from silicon in the same manner, and the coefficient of thermal expansion can be matched therewith. Therefore an advantage of effectively preventing the occurrence of exfoliation and the like in the conductive joining portion, with volume change due to temperature change can be obtained.

On the other hand, if a compact of a glass epoxy, or a ceramic or the like is used as the connector base member 36a, superior shock resistance can be obtained compared to the case of using the silicon base body.

The terminal electrodes 36b and 36c, and the connection wiring 36d constituting the connector terminal may be formed from a metal material, a conductive polymer, a superconductor, and the like. The connector terminal is preferably made from a metal material such as Au (gold), Ag (silver), Cu (copper), Al (aluminum), Pd (palladium), and Ni (nickel). In particular, the bumps 36e and 36f on the terminal electrodes 36b and 36c are preferably formed from Au. This is because, if the connection terminal 200a of the driving circuit units 200A to 200D is an Au bump, reliable joining can be readily obtained by Au—Au joining.

As shown in FIG. 11, the connector 360 including the above configuration is arranged in a state where the terminal electrodes 36b and the bumps 36e in the projecting portion 42 are oriented towards the bottom side (upper electrode film 80 side) of the slot 700, and are flip chip packaged on the upper electrode films 80 of the piezoelectric element 300 extended into the slot 700 via the bumps 36e. Moreover, the connector 360 is also arranged in a state where the terminal electrodes 36c and the bumps 36f in the end portion 41 are oriented towards the wiring pattern 34 (top face 20a of the reservoir forming substrate 20), and are flip chip packaged on the wiring pattern 34 via the bumps 36f.

In the detailed description of the packaging condition of the connector 360, of the plurality of the upper electrode films 80 arranged on the bottom face of the slot 700: the first connector terminal group 36A is electrically connected through the terminal electrodes 36b and the bumps 36e to the upper electrode films 80 of the piezoelectric elements 300 constituting the first piezoelectric element group which correspond to the first nozzle opening group 15A and the first pressure generating chamber group 12A; and the second connector terminal group 36B is electrically connected through the terminal electrodes 36b and the bumps 36e to the upper electrode films 80 of the piezoelectric elements 300 constituting the second piezoelectric element group which correspond to the second nozzle opening group 15B and the second pressure generating chamber group 12B.

Moreover, although not shown in FIG. 11, similarly to the first connector terminal group 36A, the third connector terminal group 36C is electrically connected through the terminal electrodes 36b and the bumps 36e to the upper electrode films 80 of the piezoelectric elements 300 constituting the third piezoelectric element group, and similarly to the second connector terminal group 36B, the fourth connector terminal group 36D is electrically connected through the terminal electrodes 36b and the bumps 36e to the upper electrode films 80 of the piezoelectric elements 300 constituting the fourth piezoelectric element group.

In particular in this embodiment, since the bumps 36e and 36f made from Au are provided on the terminal electrodes 36b and 36c of the connector 360, the bumps 36e and 36f are readily deformed when the connector 360 is pushed against the wiring patterns 34 and the upper electrode films 80. For example, even if the position of the terminal electrodes 36b and 36c in the Z axis direction is displaced due to the difference in the height of the connector 360 (end portion 41 and projecting portion 42), the displacement can be absorbed by the deformation of the bumps 36e and 36f, so that the terminal electrodes 36b and the upper electrode films 80, and the terminal electrodes 36c and the wiring patterns 34 can be respectively electrically connected.

As a configuration of the flip chip packaging (conductive connection structure) this may be one which uses a brazing filler metal, an anisotropic conductive material including an anisotropic conductive film (ACF) or an anisotropic conductive paste (ACP), or an insulative resin material including a non conductive film (NCF) or a non conductive paste (NCP).

Moreover, regarding the flip chip packaging of the driving circuit units 200A to 200D with respect to the wiring patterns 34, there may be employed a conductive connection structure using a brazing filler metal, an anisotropic conductive material including an anisotropic conductive film or an anisotropic conductive paste, or an insulative resin material including a non conductive film or a non conductive paste.

In order to eject droplets of the functional liquid by the droplet ejection head 1 having the above structure, an external functional liquid supplying device (not shown) connected to the functional liquid inlet 25 is driven by an external controller (not shown) connected to the droplet ejection head 1. The functional liquid sent out from the external functional liquid supplying device is supplied through the functional liquid inlet 25 to the reservoir 100, and then filled into the internal passage up to the nozzle openings 15.

Moreover, the external controller sends the driving power or the command signal to the driving circuit unit 200 and the like packaged on the reservoir forming substrate 20. The driving circuit unit 200 that has received the command signal or the like, sends the command signal based on the command from the external controller, through the wiring pattern 34, the terminal electrodes of the connector 360, and so on, to the respective piezoelectric elements 300 that are conductively connected.

Then, a voltage is applied between the respective lower electrode films 60 and upper electrode films 80 corresponding to the pressure generating chambers 12, resulting in displacement of the elastic film 50, the lower electrode film 60, and the piezoelectric film 70. Due to this displacement, the volume of the respective pressure generating chambers 12 is changed, increasing the internal pressure, to eject droplets from the nozzle openings 15.

Method of Manufacturing Connector

If a nonconductive base member such as a ceramic or a glass epoxy is used, the connector 360 used for the droplet ejection head of this embodiment can be produced by applying machine working such as grinding, and then by pattern-forming the connector terminals (terminal electrodes 36b and 36c, connection wiring 36d, and bumps 36e and 36f) on the surface of the connector base member 36a, that has been formed in the cross-sectional convex shape shown in FIG. 12. Moreover, if a conductive base body such as a silicon base body is used, the connector 360 can be produced by pattern-forming the connector terminals on the surface of a connector base member, that has been obtained by forming by thermal oxidation or the like, a silicon oxide film on the surface of the silicon base body formed in a cross-sectional convex shape by partially removing by anisotropic etching or the like, or on the surface of a connector base member that has been obtained by forming a conductive resin film on the surface of the silicon base body.

Employable examples of a method of pattern-forming the connector terminals on the connector base member 36a include: a method of patterning a conductive film that has been formed using the gas phase method by a photolithography technique; a method of arranging a mask material including openings of a predetermined pattern on the connector base member 36a so as to selectively form the conductive film (metal film) by a gas phase method or a plating method through the mask material; a method of pattern-forming the conductive film using a droplet ejection method; and a method of pattern-forming the conductive film on the connector base member 36a using a printing method.

Hereunder is a description of a method of forming the connector terminals (terminal electrodes 36b and 36c, connection wiring 36d, and bumps 36e and 36f) using the droplet ejection method, as an example of the method of manufacturing the connector 360. In this embodiment, the case of using a cross-sectional convex shaped ceramics compact as the connector base member 36a is described, however cases of using a connector base member of other materials are similar.

For forming the connector terminals by the droplet ejection method, a droplet ejection apparatus which has the droplet ejection head 1 may be preferably used. That is, an ink for forming the connector terminals is ejected from the droplet ejection head 1 provided on the droplet ejection apparatus, and arranged so as to form a predetermined pattern on the connector base member 36a. Then, a metal thin film is formed by drying and baking the ink on the connector base member 36a. By sequentially repeating the above level difference portions on the top face and the inclined-faces 42a of the projecting portion 42, and on the top face of the end portion 41 of the connector base member 36a, the terminal electrodes

36*b* and 36*c*, the connection wiring 36*d* for connecting them, and the bumps 36*e* and 36*f* can be formed on the connector base member 36*a*.

In the case where the connector terminals shown in FIG. 12 are formed from a metal film, then for example, a gold particle dispersing liquid (ULVAC Materials, Inc., product name "perfect gold") with gold particles having a diameter of about 10 nm dispersed in toluene, is diluted with toluene, so as to adjust the viscosity to about 5 mPa·s and the surface tension to about 20 mN/m, and this liquid is used as an ink for forming the terminal electrodes 36*b* and 36*c*, the connection wiring 36*d*, and the bumps 36*e* and 36*f*.

Procedure for Forming Connector Terminals

Once the above ink has been prepared, a step for ejecting droplets of the ink from the droplet ejection head 1, and arranging them on the connector base member 36*a*, is performed.

Here, prior to the droplet ejecting level difference portion, a surface treatment may be performed on the connector base member 36*a*. That is, regarding the surface of the connector base member 36*a* to be coated with the ink, prior to the ink coating, an ink repellent treatment (liquid repellent treatment) may be applied. By applying such an ink repellent treatment, the position of the ink to be ejected and arranged (coated) onto the connector base member 36*a* can be highly accurately controlled.

After the ink repellent treatment is applied onto the surface of the connector base member 36*a* as necessary, droplets of the ink are ejected from the droplet ejection head 1, and dropped in a predetermined position on the connector base member 36*a*. In this level difference portion, by ejecting droplets onto the connector base member 36*a* while scanning the droplet ejection head 1, a plurality of ink patterns (for example, ink pattern to become the terminal electrodes 36*b*) are formed on one side of the connector base member 36*a*.

At this time, in the case where the droplets are continually ejected to perform the pattern-forming, the degree of overlapping of the droplets is preferably controlled so as to not generate liquid pools (bulges). In this case, bulges can be satisfactorily prevented if there is employed a ejecting and arranging method such that, when ejecting at the first time, a plurality of droplets are ejected and arranged separated so that they do not make contact with each other, and then the spaces therebetween are filled by ejecting at the second time and thereafter.

After the droplets are ejected and the predetermined ink pattern is formed on the connector base member 36*a*, in order to remove the dispersion medium from the ink, a drying treatment is performed as necessary. The drying treatment may be also performed by lamp annealing, in addition to for example, treatment by a normal hot plate or an electric furnace, or the like that heats the substrate. Although the light source of the light used for lamp annealing is not specifically limited, an infrared ray lamp, a xenon lamp, a YAG laser, an argon laser, a carbon dioxide gas laser, an excimer laser of for example XeF, XeCl, XeBr, KrF, KrCl, ArF, ArCl, and the like may be used as the light source.

Next, with respect to the dried film that has been obtained by drying the ink pattern, a baking treatment for improving the electrical contact between particles is performed. By this baking treatment, the dispersion medium is completely removed from the dried film, and moreover if an organic coating or the like for improving the dispersibility is applied onto the surface of the conductive particles, the coating is also removed.

The baking treatment is performed by heat treatment, light treatment, or a combination thereof. The baking treatment is normally performed in the air, however it may be performed in an inert gas atmosphere of nitrogen, argon, helium, or the like as necessary. The temperature of the baking treatment is appropriately determined by considering the boiling point (vapor pressure) of the dispersion medium, the type and the pressure of the atmospheric gas, the thermal behavior such as the dispersibility and the oxidizability of the particles, the presence/absence and the amount of the coating material, the heat-resistive temperature of the base member, and the like. For example, in order to remove the coating material made from an organic substance, it is necessary to bake at about 300° C. Moreover, in the case of using a substrate of a plastics or the like, baking is preferably performed at room temperature or more but 100° C. or less.

By the above level difference portion, electrical contact between the particles in the film is ensured and the film is converted into a conductive film.

Then, by performing the above droplet ejecting level difference portion, drying level difference portion, and baking level difference portion onto the respective sides of the connector base member 36*a*, the connector 360 formed with a plurality of connector terminals on the connector base member 36*a* can be manufactured.

Alternatively, the conversion from the dried film into the conductive film may be performed by performing the droplet ejecting level difference portion and the drying level difference portion on the respective sides of the connector base member 36*a*, to thereby form dried films of the predetermined pattern on the respective sides of the connector base member 36*a*, and then performing the baking step for the whole. Since the dried film has many gaps between the conductive particles constituting it, if the ink is arranged thereon, the ink can be held satisfactorily. Consequently, in a state with the dried film formed on one side of the connector base member 36*a*, the droplet ejecting level difference portion is performed on the other side, and by so doing, the connectability of the dried films formed on the respective sides can be improved. That is, the connectability in the joining part between the terminal electrodes 36*b* and the connection wiring 36*d*, and the joining part between the terminal electrodes 36*c* and the connection wiring 36*d* can be improved, and connector terminals having more superior reliability can be formed.

Method of Manufacturing Droplet Ejection Head

Figure 13:
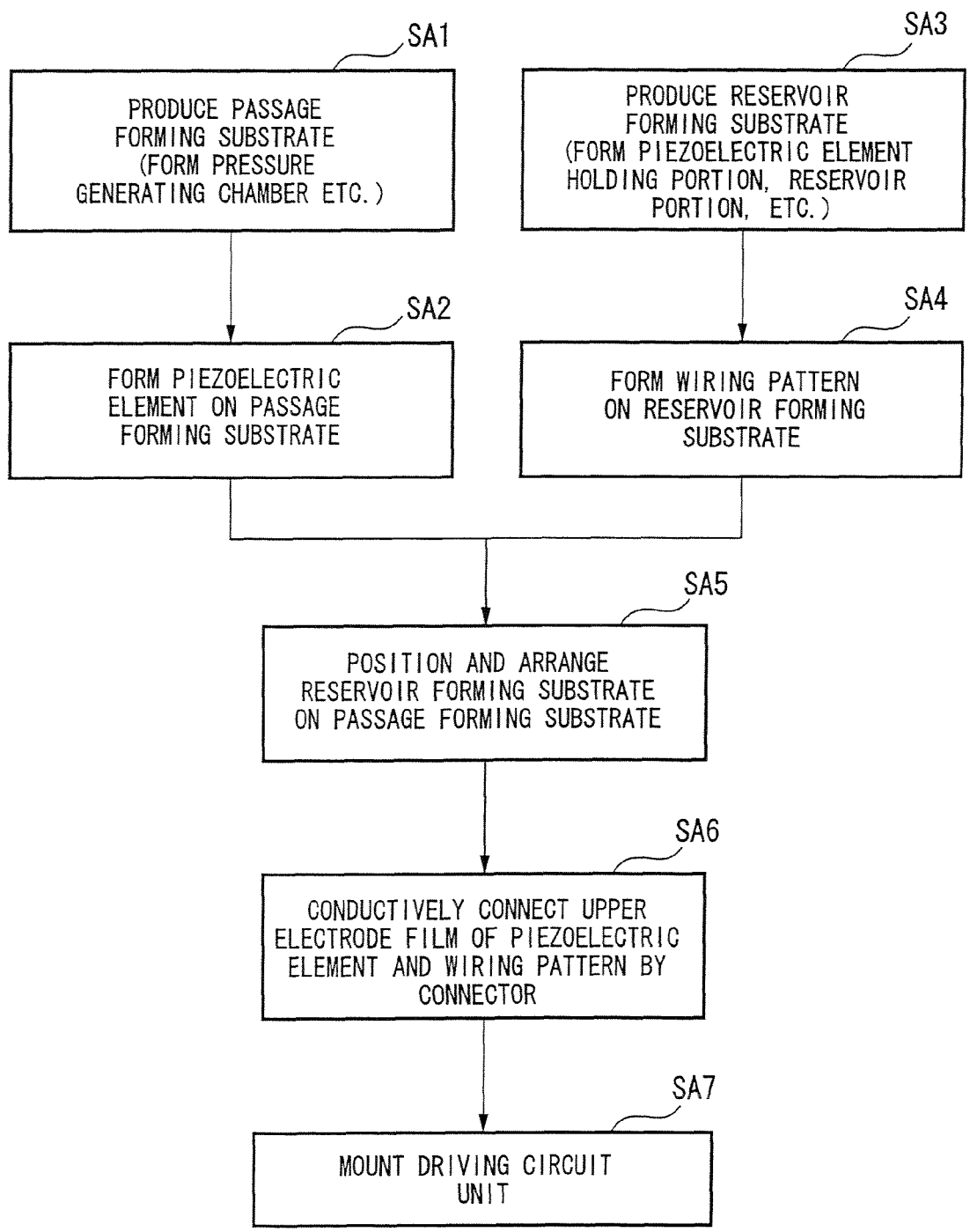
FIG. 13 is a flowchart of a method of manufacturing a droplet ejection head.

Next is a description of a method of manufacturing the droplet ejection head 1, with reference to the flowchart of FIG. 13.

In order to manufacture the droplet ejection head 1, for example, anisotropic etching is applied to the silicon single crystal substrate, to thereby form the pressure generating chamber 12, the supply path 14, the communicating portion 13, and the like shown in FIG. 11, to produce the passage forming substrate 10 (Level difference portion SA1). Then, the elastic film 50 and the lower electrode film 60 are formed in laminations on the passage forming substrate 10, and then the piezoelectric film 70 and the upper electrode film 80 are pattern-formed on the lower electrode film 60, to thereby form the piezoelectric elements 300 (Level difference portion SA2).

Moreover, anisotropic etching is applied to the silicon single crystal substrate in a different level difference portion from Level difference portions SA1 and SA2, to thereby form the piezoelectric element holding portion 24, the slot 700, and the introduction path 26, and the reservoir portion 21 is formed using the dry etching method, to thereby produce the reservoir forming substrate 20 (Level difference portion SA3). Next, the compliance substrate 30 is joined onto the reservoir forming substrate 20, to form the wiring patterns 34 (Level difference portion SA4).

Next, the reservoir forming substrate 20 that has gone through Level difference portion SA4 is positioned in the position covering the piezoelectric elements 300 on the passage forming substrate 10 that has gone through Level difference portion SA2 (Level difference portion SA5). Then, the passage forming substrate 10 and the reservoir forming substrate 20 are adhered, and the connector 360 is inserted into the slot 700, so as to connect the upper electrode films 80 (circuit connecting unit) of the piezoelectric elements 300, and the wiring patterns 34 (Level difference portion SA6). When the connector 360 is inserted into the slot 700, by measuring the alignment marks AM formed on the connector 360, the positioning with respect to the reservoir forming substrate 20 can be readily and accurately performed.

Next, the driving circuit units 200A to 200D are flip chip packaged on the wiring patterns 34 on the reservoir forming substrate 20 (Level difference portion SA7).

Level difference portion SA6 and Level difference portion SA7 may be in the opposite sequence.

By the above level difference portions, the droplet ejection head 1 can be manufactured.

As in the above manner, in this embodiment, by arranging the connector 360 in the slot 700 provided in the reservoir forming substrate 20, the circuit connecting units (upper electrode films 80) of the piezoelectric elements 300, and the wiring patterns 34 connected to the connection terminals 200a of the driving circuit units 200A to 200D that have been arranged with a level difference portion, can be electrically connected. The space where the wire is led out in a structure where the driving circuit unit and the piezoelectric element are connected by wirebonding, becomes unnecessary, and the droplet ejection head 1 can be made thinner. Moreover, since the slot 700 is filled by the connector 360, the rigidity of the droplet ejection head 1 itself can be increased, and a decrease in the ejection accuracy due to warping and the like can be effectively prevented.

Furthermore, in this embodiment, by confirming the conduction of the wiring patterns 34 connected to the connection terminals 200a of the driving circuit units 200A to 200D, it is possible to check the conduction of the driving circuit units 200A to 200D before packaging the connector 360.

Moreover, in this embodiment, even in the case where the pitch of the piezoelectric elements 300 becomes narrower, with narrowing of the pitch of the nozzle openings 15, so that it is extremely difficult to perform wirebonding, the driving circuit units 200A to 200D and the piezoelectric elements 300 can be electrically connected with ease. That is, the terminal electrodes 36b to 36f of the connector 36 can be formed to an accurate dimension at an accurate position. Therefore, even if the pitch of the nozzle openings 15 is narrowed, it is possible to produce a terminal electrode which can be accurately positioned with respect to the piezoelectric elements 300 arranged at a narrow pitch according to the nozzle pitch. Consequently, according to this embodiment, it is possible to obtain a droplet ejection head 1 which can form an image with high definition, and form a pattern of a functional film.

Moreover, in this embodiment, since the connector 360 has the inclined-faces 42a, these become guides when it is inserted into the slot 700, enabling a stable connecting operation. Also, since the projecting portion 42 having the inclined-faces 42a is formed narrower than the slot 700, contact between the wiring pattern 34 and the connector 360 causing a short-circuit between the terminals can be prevented. Furthermore, in this embodiment, the inclined-faces 42a intersect at an obtuse angle with respect to the top face of the projecting portion 42 formed with the terminal electrodes 36b, and the top face of the end portion 41 formed with the terminal electrodes 36c. Therefore, it is possible to reduce the stress concentration applied to the terminal electrodes formed in the intersection part of the respective faces, and the occurrence of disconnection and the like can be suppressed. Moreover, there is also demonstrated an effect of facilitating the formation of wiring to the inclined-faces 42a, compared to the case where they are orthogonal to the top face of the projecting portion 42 and the top face of the end portion 41

Furthermore, in this embodiment, since the bumps 36e and 36f are provided on the connector 360 and connected to the upper electrode films 80 and the wiring patterns 34, the bumps 36e and 36f can be readily deformed when the connector 360 is pushed against them, and for example, even if the position of the terminal electrodes 36b and 36c in the Z axis direction is displaced due to the difference in the height of the connector 360 (end portion 41 and projecting portion 42), the displacement can be absorbed by the deformation of the bumps 36e and 36f, so that the terminal electrodes 36b and the upper electrode films 80, and the terminal electrodes 36c and the wiring patterns 34 can be respectively electrically connected stably. In addition, in this embodiment, since the coefficient of linear expansion of the base member 36a of the connector 360 is made the same as that of the passage forming substrate 10 and the reservoir forming substrate 20, then an advantage of effectively preventing the occurrence of exfoliation and the like in the conductive joining portion, with volume change due to temperature change can be obtained.

Furthermore, in this embodiment, since the configuration is such that the driving circuit units 200A to 200D and the connector 360 are flip chip packaged, it is possible to package them at once by means of the same device (packaging device), contributing to an improvement in production efficiency.

In the droplet ejection head 1 of this embodiment, since the reservoir forming substrate 20 is also designed to function as a sealing member which blocks the piezoelectric elements 300 from the external environment to seal the piezoelectric elements 300, then deterioration in the properties of the piezoelectric elements 300 due to the external environment such as moisture and the like can be prevented. Moreover, in this embodiment, the inside of the piezoelectric element holding portion 24 is only sealed. However there may be employed a structure in which for example, the space in the piezoelectric element holding portion 24 is evacuated, or made a nitrogen or argon atmosphere, or the like, to thereby maintain the inside of the piezoelectric element holding portion 24 at a low humidity. By such a structure, deterioration in the piezoelectric elements 300 can be further effectively prevented.

Droplet Ejection Apparatus

Next is a description of an example of a droplet ejection apparatus including the droplet ejection head 1 described above, with reference to FIG. 14. In the present example, as an example thereof, an inkjet recording apparatus including the droplet ejection head is described.

Figure 14:
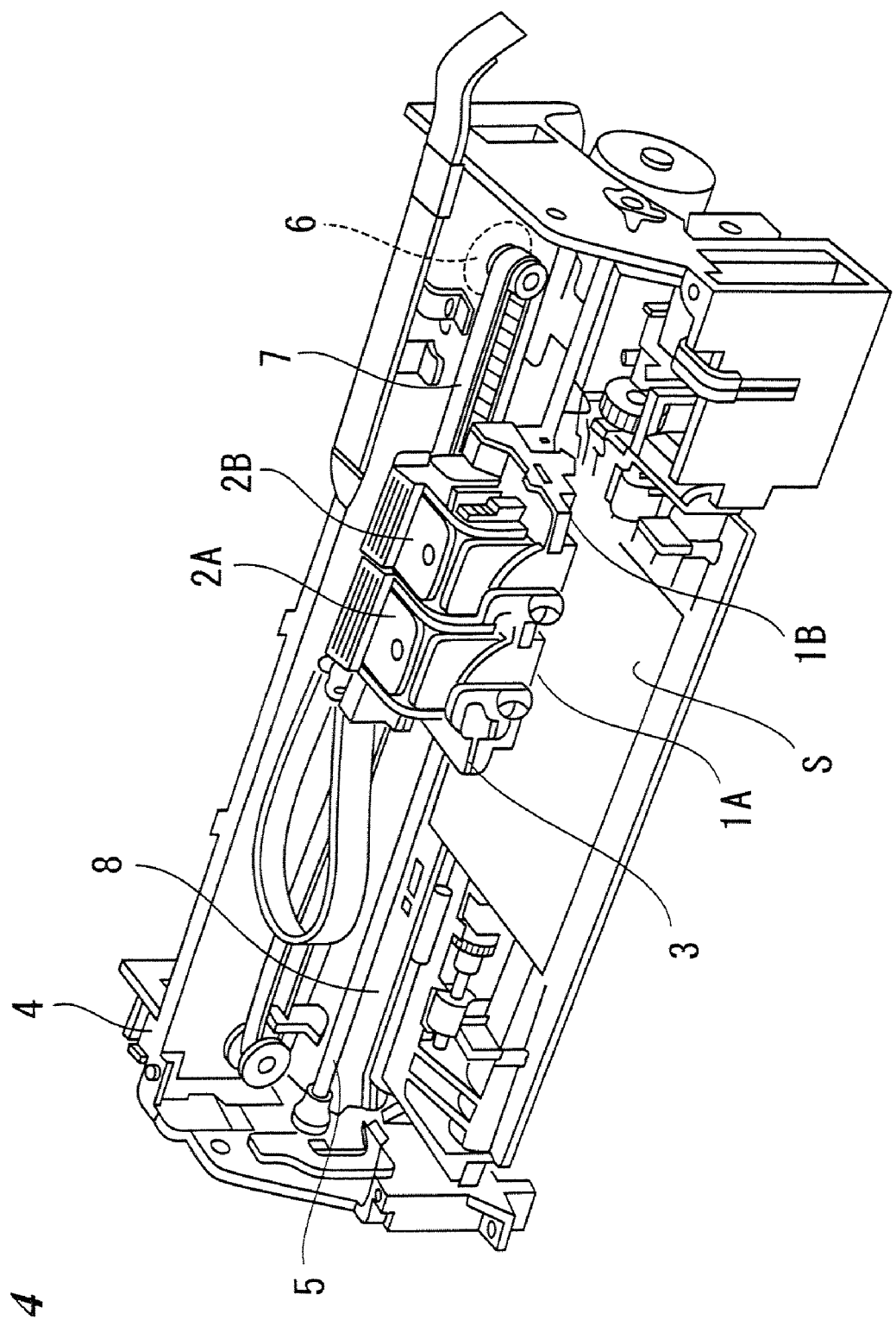
FIG. 14 is a perspective view of an example of a droplet ejection apparatus.

The droplet ejection head partially constitutes a recording head unit including an ink passage that is communicated to an ink cartridge and the like, and is packaged in the inkjet recording apparatus. As shown in FIG. 14, on the recording head units 1A and 1B having the droplet ejection heads, are removably provided cartridges 2A and 2B constituting ink supply devices. A carriage 3 on which these recording head units 1A and 1B are packaged, is attached so as to be movable in the axial direction, to a carriage shaft 5 that is attached to the apparatus main frame 4.

The recording head units 1A and 1B are respectively designed to eject for example, a black ink composition and a color ink composition. Moreover, the configuration is such that, the driving force of a drive motor 6 is transferred through a plurality of gears (not shown) and a timing belt 7, to the carriage 3, to thereby move the carriage 3 on which the recording head units 1A and 1B are packaged, along the carriage shaft 5. On the other hand, the apparatus main frame 4 is provided with a platen 8 along the carriage shaft 5, so that a recording sheet S serving as the recording medium such as a paper fed by a paper feed roller (not shown) or the like is supplied onto the platen 8. Since the inkjet recording apparatus having the above structure includes the abovementioned droplet ejection head, the inkjet recording apparatus is small in size, highly reliable, and low in cost.

In FIG. 14, as an example of the droplet ejection apparatus of this invention, the inkjet recording apparatus serving as a single printer is shown. However, this invention is not limited to this, and may be applied to a printer unit which can be realized by incorporating such a droplet ejection head. Such a printer unit is installed for example in a display device such as a television, or an input device such as a white board, and is used for printing the image that has been displayed or inputted by the display device or the input device.

The droplet ejection head may be suitably used for a droplet ejection apparatus for forming various kinds of devices by the liquid phase method. In this configuration, as the functional liquid to be ejected from the droplet ejection head, there may be used inks containing a liquid crystal display device forming material for forming a liquid crystal display device, an organic EL display forming material for forming an organic EL display device, a wiring pattern forming material for forming a wiring pattern of an electronic circuit, and the like. According to the manufacturing process of selecting and arranging these functional liquids onto the base body by the droplet ejection apparatus, since pattern-arrangement of the functional materials is possible without going through the photolithography level difference portion, a liquid crystal display device, an organic EL display device, a circuit board, and the like can be manufactured at low cost.

In the above, preferred embodiments according to this invention have been described with reference to the appended drawings. However this invention is of course not limited to such examples. Various forms and combinations of the respective components shown in the abovementioned examples are exemplary, and may be variously modified according to design requirements and the like, without departing from the scope of this invention.

For example, in the above embodiment, the configuration is such that the bumps are provided on the connector 360. However the invention is not limited to this, and the configuration may be such that they are provided to the upper electrode film 80 and the wiring pattern 34.

Moreover in the above embodiment, the configuration is such that the slot 700 and the projecting portion 42 of the connector 360 are both formed in a tapered shape. However the configuration may be such that either one or both of them are formed with the same diameter.

In the above embodiment, as an example of a semiconductor device, an example of a droplet ejection head where the driving circuit units 200A to 200D are packaged on the base body, is described as a device. However, the invention is not limited to this, and is also applicable to a semiconductor device having a structure where electrical devices are three-dimensionally packaged.

What is claimed is:

1. A connector used for a device package structure that is configured to include: a nozzle substrate which includes nozzle openings through which droplets are ejected; a passage forming substrate which is connected to a to face of the nozzle substrate to form ink passages; piezoelectric element having an upper electrode film; a vibration plate which is connected to a top face of the passage forming substrate and is displaced by drive of the piezoelectric element; a reservoir forming substrate which is connected to a to face of the vibration plate to form reservoirs and which has a slot having a tapered shape such that the diameter of the slot is decreased as the cross-section goes downward; driving circuit unit for driving the piezoelectric element, provided on the reservoir forming substrate; and a wiring pattern which are connected to the driving circuit unit, the connector being arranged in the slot and being positioned on the upper electrode film of the piezoelectric element that has been exposed to a bottom face of the slot, the connector comprising:

a silicon base body formed in a cross-sectional convex shape by partially removing by anisotropic etching, the silicon base body having a surface formed with a silicon oxide film by thermal oxidation, the silicon base body having a projecting portion and an end portion;

a first terminal electrode provided on a first face of the silicon base body;

a second terminal electrode provided on a second face of the silicon base body;

a connection wiring formed on an inclined-face between the first face and the second face, the connecting wiring electrically connecting between the first terminal electrode and the second terminal electrode;

a first conductive projected portion provided on the first terminal electrode; and a second conductive projected portion provided on the second terminal electrode, wherein the first terminal electrode and the first conductive projected portion in the projecting portion are oriented toward the bottom face of the slot and are flip chip packaged on the upper electrode film of the piezoelectric element extended into the slot via the first conductive projected portion; and the second terminal electrode and the second conductive projected portion in the end portion are oriented toward the wiring pattern and are flip chip packaged on the wiring pattern via the second conductive projected portion.

\* \* \* \* \*